United States Patent
Fujiwara et al.

(10) Patent No.: US 8,659,969 B2
(45) Date of Patent: Feb. 25, 2014

(54) SEMICONDUCTOR DEVICE

(75) Inventors: Hidehiro Fujiwara, Kanagawa (JP); Koji Nii, Kanagawa (JP); Makoto Yabuuchi, Kanagawa (JP); Kazutami Arimoto, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 354 days.

(21) Appl. No.: 13/215,217

(22) Filed: Aug. 22, 2011

(65) Prior Publication Data

US 2012/0044777 A1 Feb. 23, 2012

(30) Foreign Application Priority Data

Aug. 23, 2010 (JP) ................. 2010-186040

(51) Int. Cl.
*G11C 5/14* (2006.01)
(52) U.S. Cl.
USPC .......................................... 365/226; 365/201
(58) Field of Classification Search
USPC ................................................ 365/226, 201
See application file for complete search history.

(56) References Cited

U.S. PATENT DOCUMENTS 6,498,761 B2 * 12/2002 Banba et al. .................. 365/226

OTHER PUBLICATIONS

Lofstrom, et al., "IC Identification Circuit using Device Mismatch," 2000 IEEE Solid-State Circuits Conference, WP 22.6.
Su et al., "A 1.6pJ/bit 96% Stable Chip-ID Generating Circuit using Process Variations," 2007 IEEE Solid-State Circuits Conference, pp. 406, 407, and 611.

* cited by examiner

*Primary Examiner* — Son Dinh
*Assistant Examiner* — Nam Nguyen
(74) *Attorney, Agent, or Firm* — Miles & Stockbridge P.C.

(57) ABSTRACT

By using a fact that a bit error in an on-chip embedded memory occurs at a random address, means for creating a chip-unique ID and utilizing this ID are provided. A controller having received a verification request from outside instructs a variable power supply circuit to decrease a voltage supplied to a memory to be lower than that at the normal operation time. When the voltage supplied to the memory is stabilized, the controller requests a memory test to a memory BIST. By using an address where an error occurs due to a result of the memory test, the controller creates the chip-unique ID and uses the ID as a response to the verification request.

22 Claims, 25 Drawing Sheets

FAIL BIT MAP OF MEMORY 103 (CHIP-UNIQUE ID)

☐ Pass   ▦ 0.8V Fail   ▨ 0.6V Fail

FAIL BIT MAP OF MEMORY 103 (CHIP-UNIQUE ID)

☐ Pass   ▨ 0.8V Fail   ▦ 0.6V Fail

SEMICONDUCTOR DEVICE

CROSS-REFERENCE TO RELATED APPLICATION

The present application claims priority from Japanese Patent Application No. 2010-186040 filed on Aug. 23, 2010, the content of which is hereby incorporated by reference into this application.

TECHNICAL FIELD OF THE INVENTION

The present invention relates to verification of a semiconductor device. More particularly, the present invention relates to a verification test by a hardware on which dedicated processes are implemented as less as possible.

BACKGROUND OF THE INVENTION

A market of an electronic commerce service via the Internet such as e-commerce and net banking has steadily expanded. Also, an electronic money service using an IC card has entered into spread/expansion period. And, in these services, a higher-leveled security technique is always demanded.

In a software level, sufficient security has been achieved by an encryption technique with a central focus on strong encryption algorithm. On the other hand, in a hardware level on which the similar algorithm is physically implemented, it has been pointed out that there is a possibility of allowing an attacker such as a hacker (cracker) to decipher a secret key.

Conventionally, a method of storing an ID at manufacturing by using Fuse or a non-volatile memory has been used. These techniques are described in "ID Identification Circuit using Device Mismatch, K. Lofstrom, et al., ISSCC2000" (Non-Patent Document 1) and "A 1.6 pJ/bit 96% Stable Chip-ID Generating Circuit using Process Variations, Y. Su, et al., ISSCC2007" (Non-Patent Document 2).

FIG. 1A shows that a comparator 9001s is used for inspecting a transistor array 9003s included in a cell array 9003.

Each of transistors T1, T2, T3, . . . , Tn in the transistor array 9003s has a different threshold voltage from each other. These threshold voltages are different among products at the manufacturing stage, and are unique for each chip.

By an address decoder 9004, a transistor accessed in each cycle is switched. In this manner, an intermediate potential V1 between a resistor 9002s and the transistor array 9003s is changed in accordance with operations of the transistors. As described above, the threshold voltage of each transistor varies for each product. Therefore, the intermediate potential V1 is changed due to random variations.

Figure 1A:
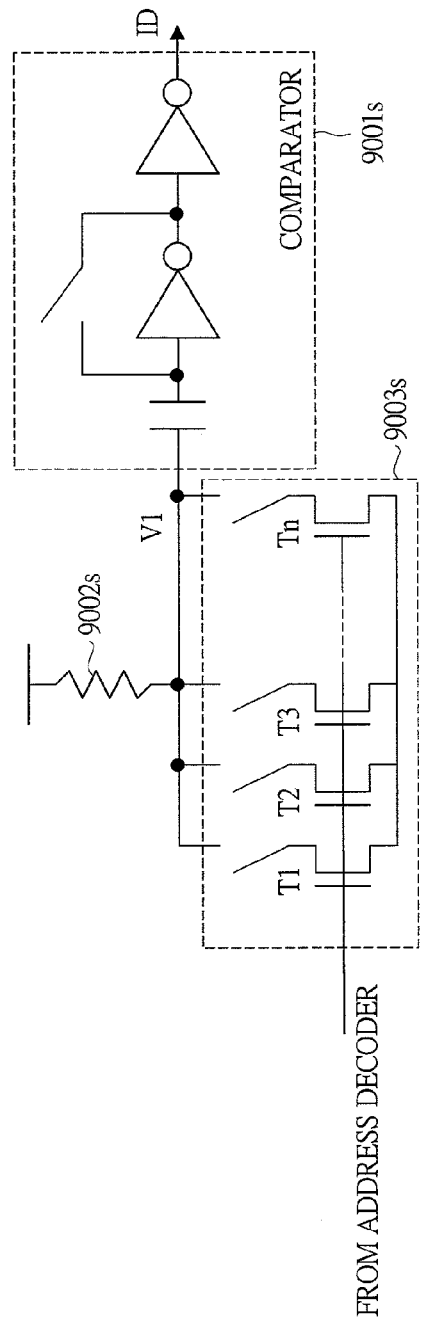
FIGS. 1A and 1B are conceptual diagrams for describing an operation of Non-Patent Document 1. Also.
Figure 1B:
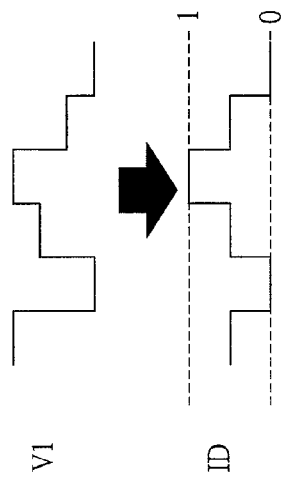

FIG. 1B is a diagram showing a correspondence between the intermediate potential V1 and an ID which is a comparator output. As showed in the figure, output values of an N cycle and an (N−1) cycle are compared with each other for conversion from an analog value to a digital value, so that a chip-unique data column (chip-unique ID) is generated.

By comparing the generated data column and a chip-unique ID previously stored in a database at the manufacturing, the ID is verified.

Figure 2:
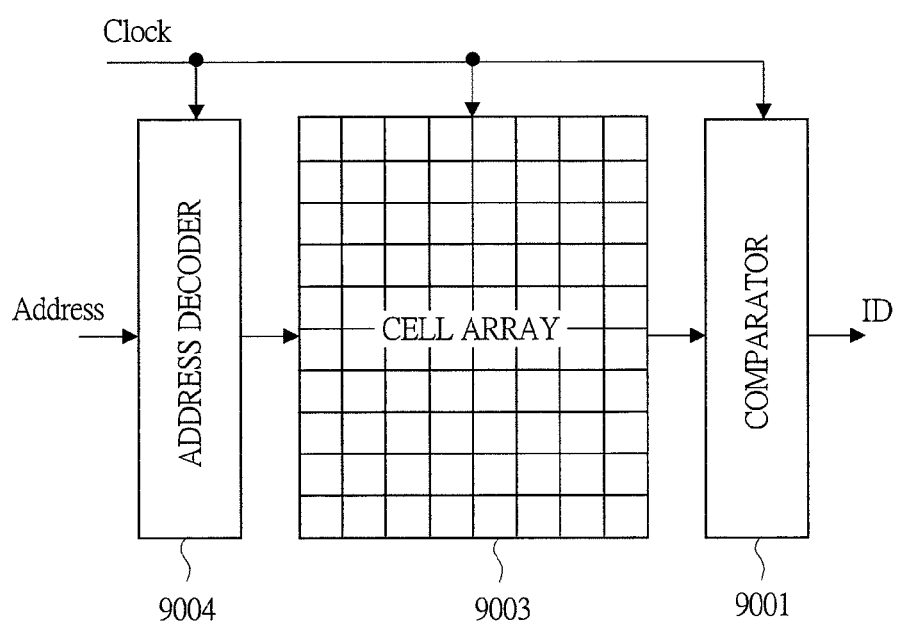
FIG. 2 is a diagram in a case that the technique of Non-Patent Document 1 is practically applied to inspection of a cell array.

FIG. 2 shows a structure including the address decoder 9004 at generating the unique ID for the cell array 9003 in FIGS. 1A and 1B.

Figure 3:
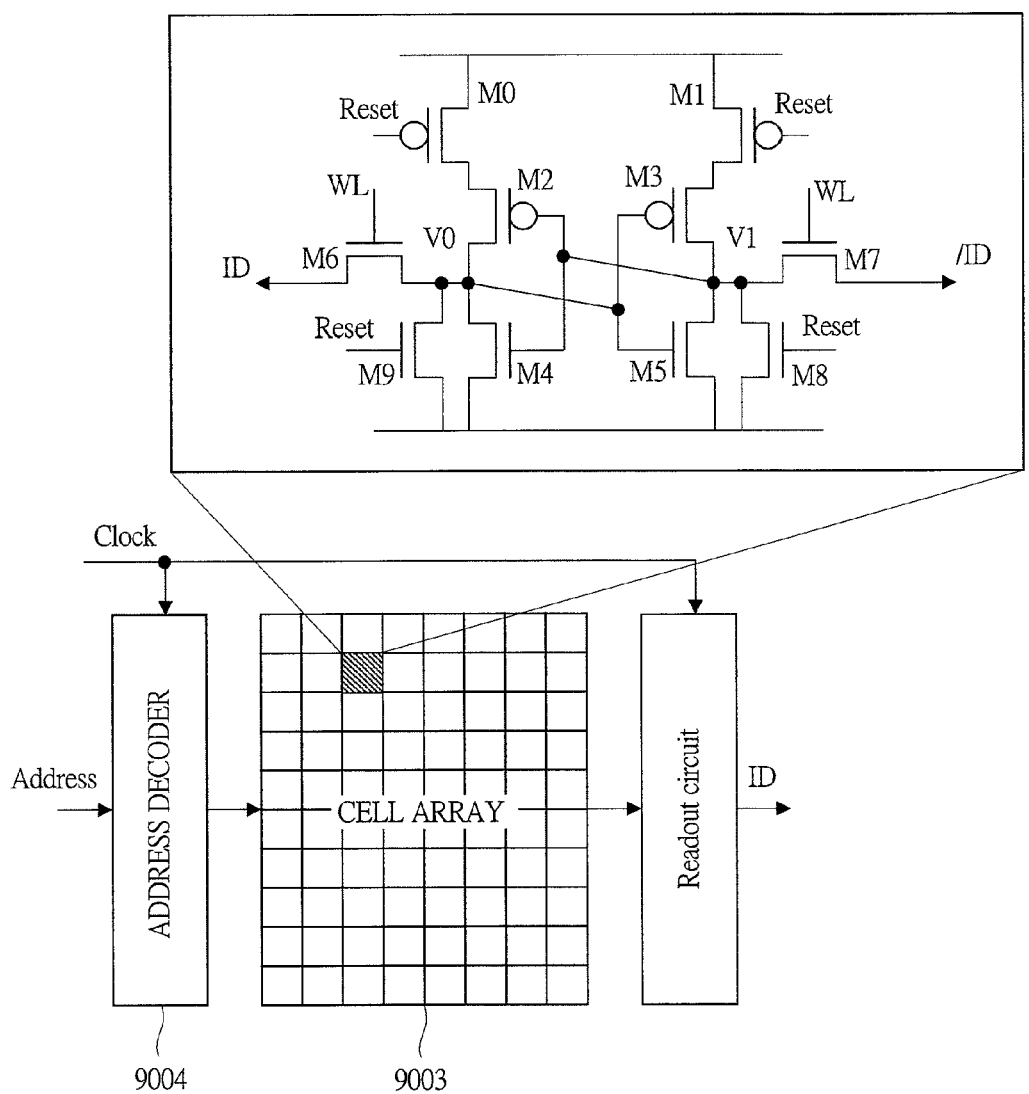

FIG. 3 is a conceptual diagram for describing an operation of Non-Patent Document 2.

In a method of Non-Patent Document 2, the chip-unique ID is generated by using a cross-coupled NOR. Similarly to the transistors T1, T2, T3, . . . , Tn in FIG. 1A, each of threshold voltages of transistors M0 to M9 in this figure is also different for each cell. Further, by the threshold voltages of the transistors M0 to M9 in this figure, a value (V0, V1) stored in each cell is determined.

Similarly to a method of Non-Patent Document 1, by switching a cell accessed in each cycle, the data column of the chip-unique ID is generated. In the technique described in Non-Patent Document 2, the data column of the chip-unique ID is generated by using a cross-coupled converter, and therefore, the technique is different from that of Non-Patent Document 1, and has a feature that an amplifier with a low offset is not required.

SUMMARY OF THE INVENTION

However, in the method of storing the ID as described above, a dedicated process is required, and therefore, its cost is increased. Also, there is a problem of a risk such that a data written at the manufacturing is falsified at practical using.

Further, in both techniques of Non-Patent Documents 1 and 2, a dedicated hard macro is required for generating the chip-unique ID. Therefore, its cost is increased due to increases in an area overhead and the number of pins.

Still further, since the dedicated hard macro is used, a bit length for identification is limited.

A preferred aim of the present invention is to provide means for generating a chip-unique ID by using a fact that a bit error of an on-chip embedded memory occurs at a random address and utilizing this ID.

The above and other preferred aims and novel characteristics of the present invention will be apparent from the description of the present specification and the accompanying drawings.

The typical ones of the inventions disclosed in the present application will be briefly described as follows.

A semiconductor device according to a typical embodiment of the present invention includes: a memory cell array in which a plurality of memory cells are arranged; a verification input/output unit to/from which a chip verification signal can be inputted and a chip response signal can be outputted; a variable power supply circuit which can supply at least a first power supply voltage used for a normal operation and a second power supply voltage used for evaluation to the memory cell array; a test circuit which extracts an address of a memory cell from which an error data is to be read; and a test-circuit controlling circuit which generates the chip response signal based on an output from the test circuit.

By using the semiconductor device according to the present invention, a memory which can be used for a normal function operation can be used for generating an ID, so that an area overhead does not occur.

Also, by using the semiconductor device according to the present invention, multiple bit for a bit length for identification in a SoC and a microcomputer on which a large number of memories are mounted can be easily achieved. As a result, weakness of a chip can be improved.

BRIEF DESCRIPTIONS OF THE DRAWINGS

Figure 4:
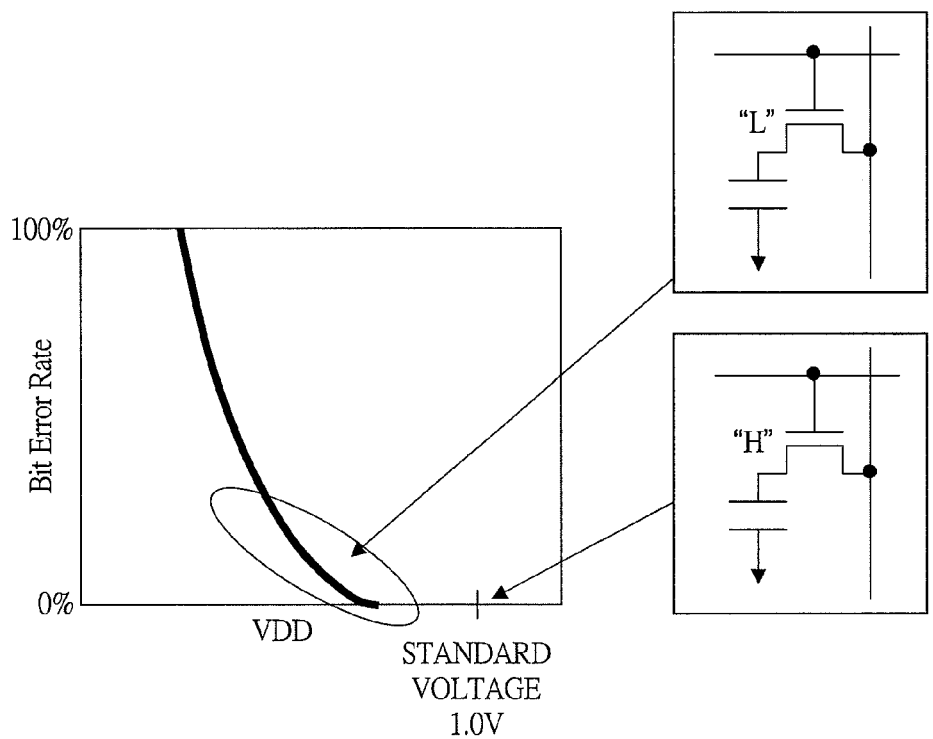
Figure 5:
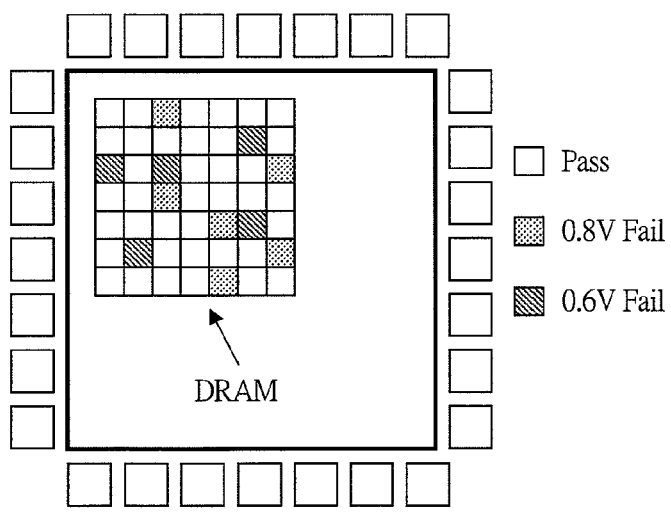
Figure 6:
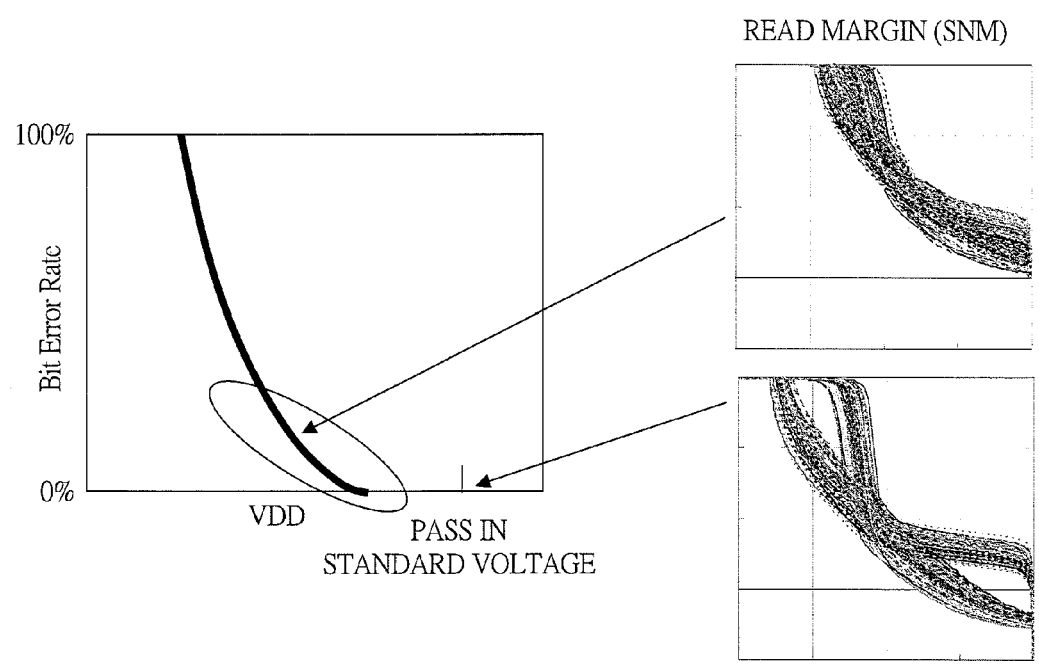
Figure 7:
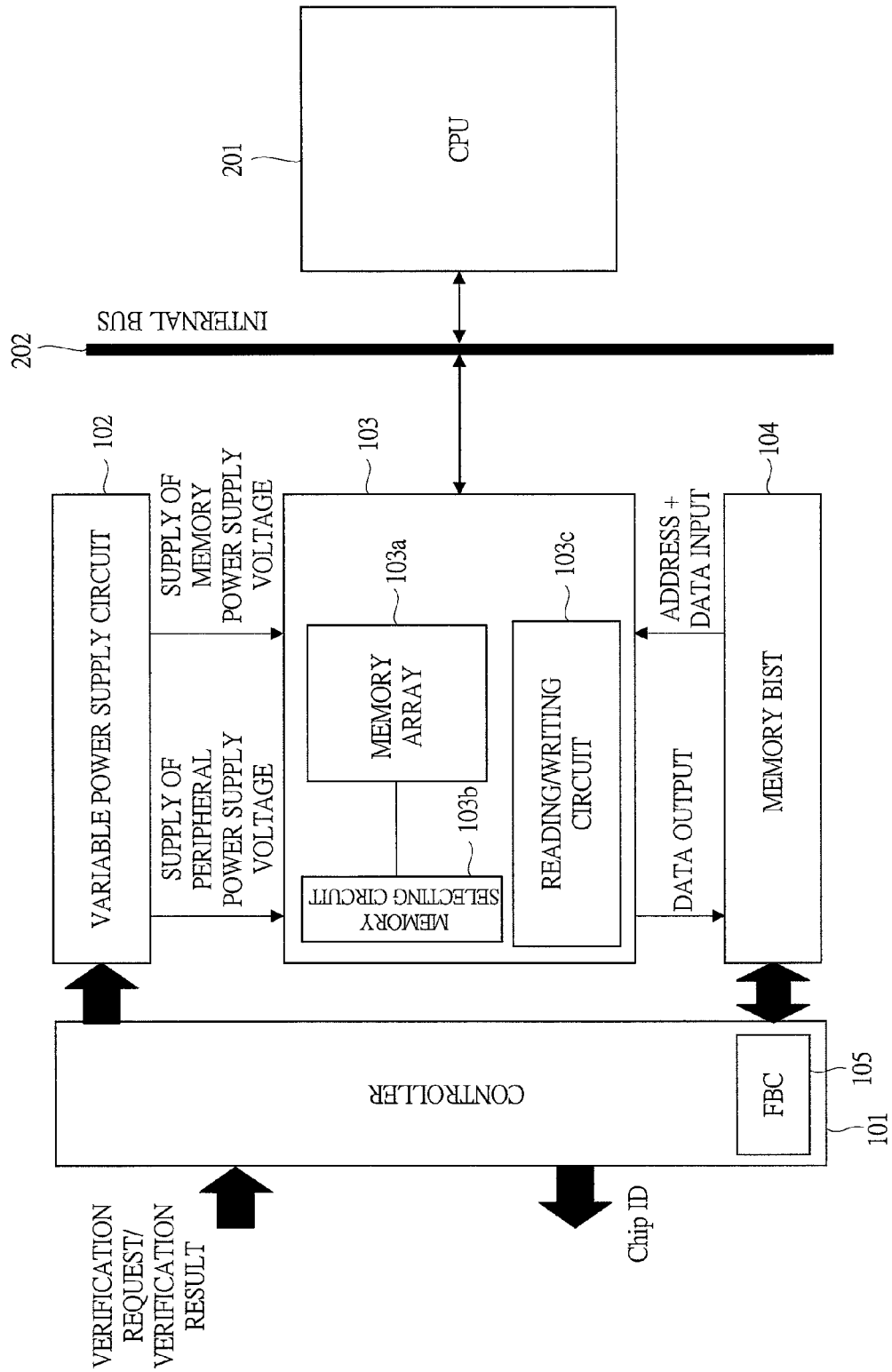
Figure 8:
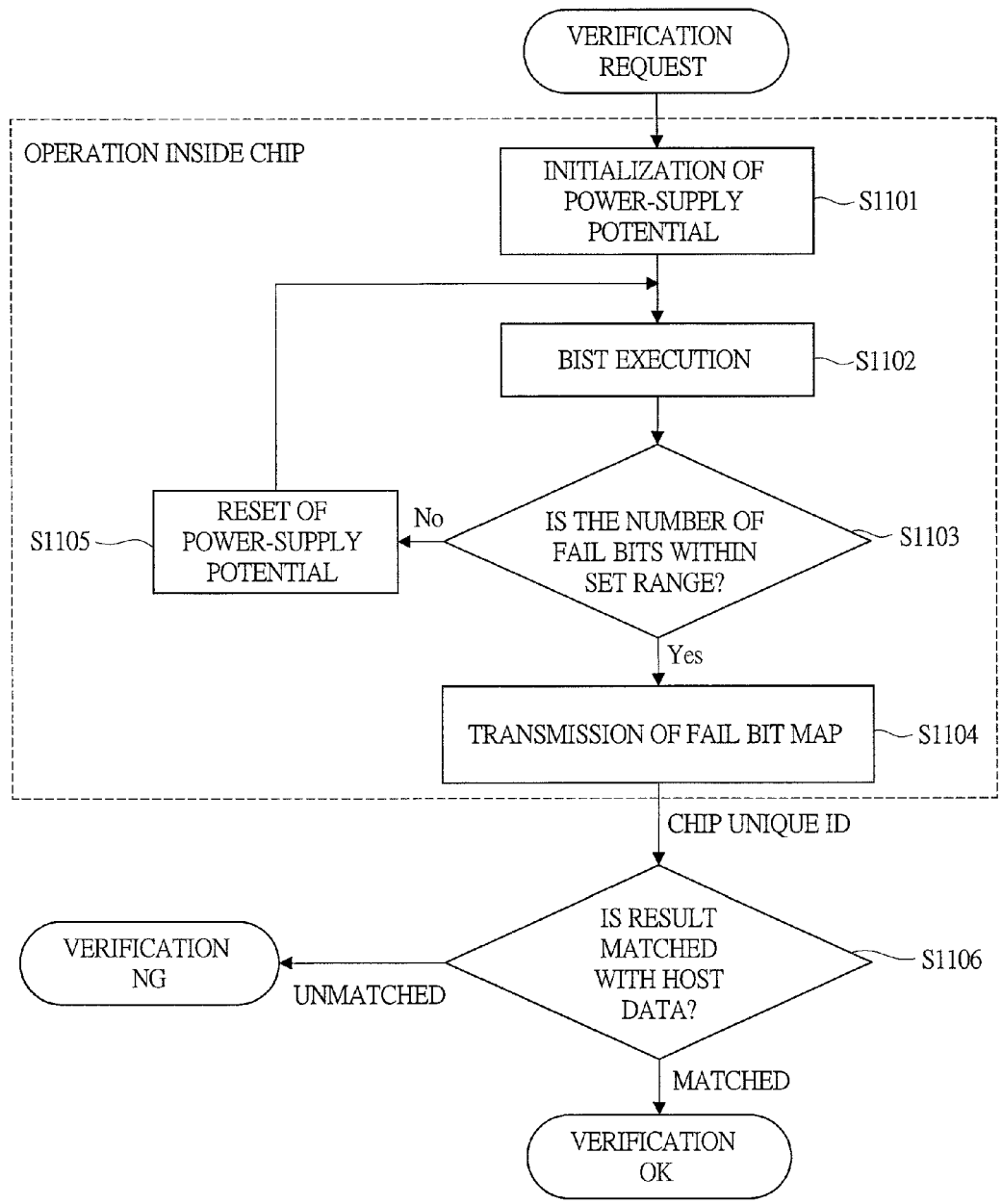
Figure 9:
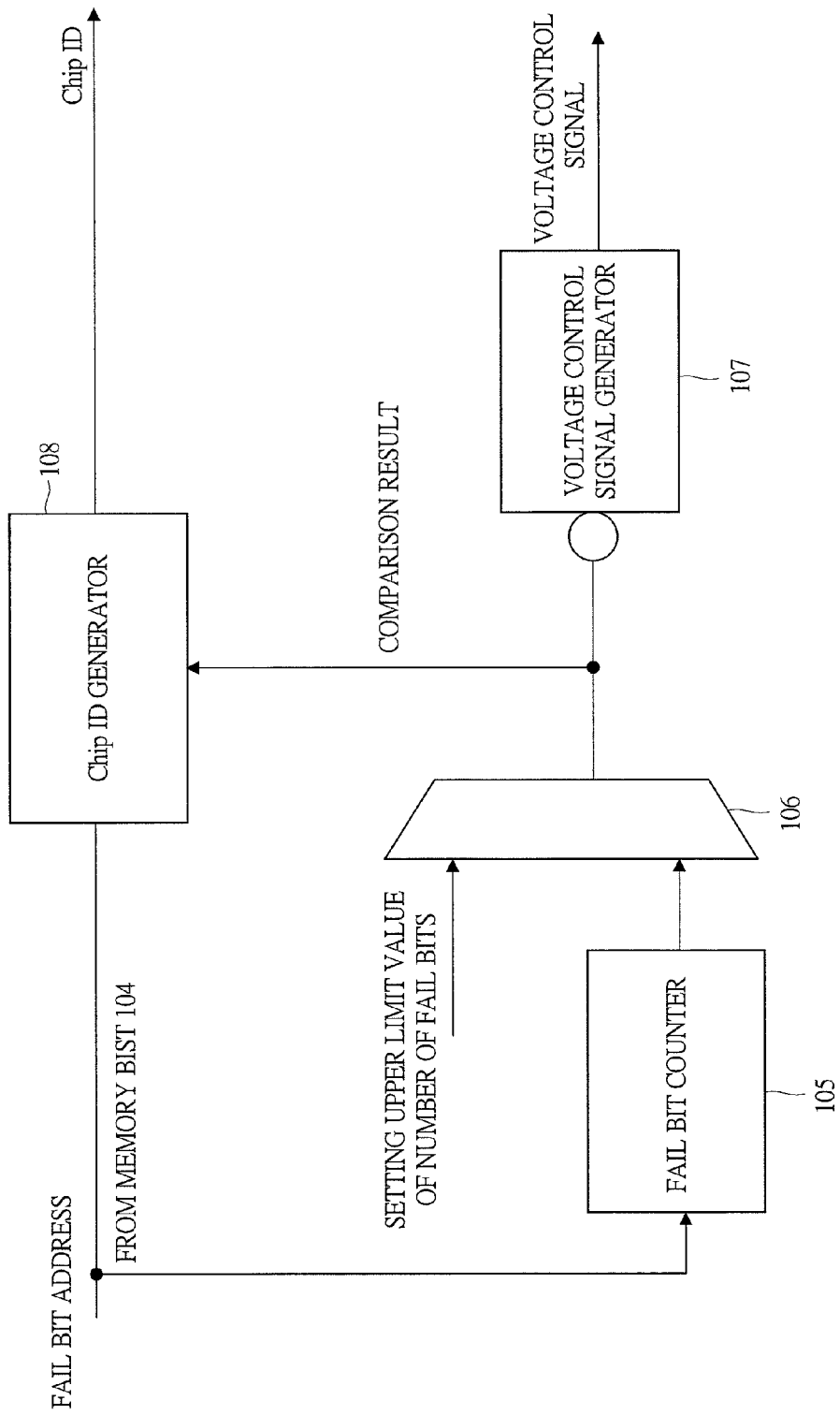
Figure 10:
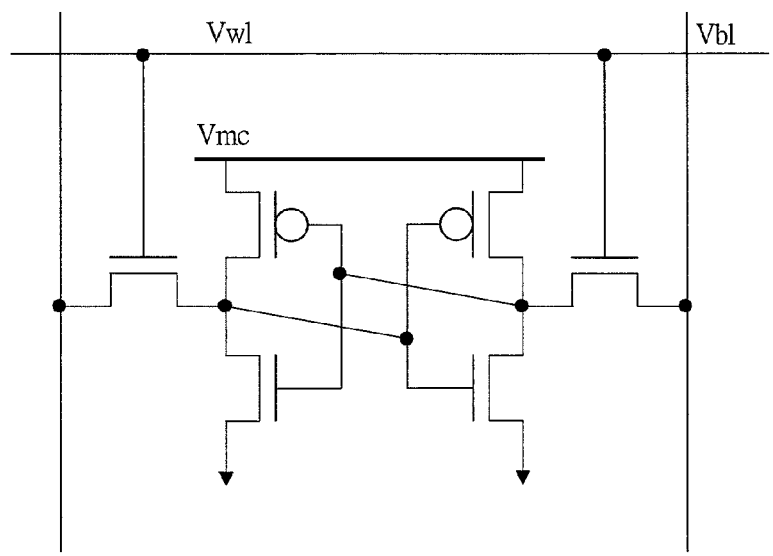
Figure 11:
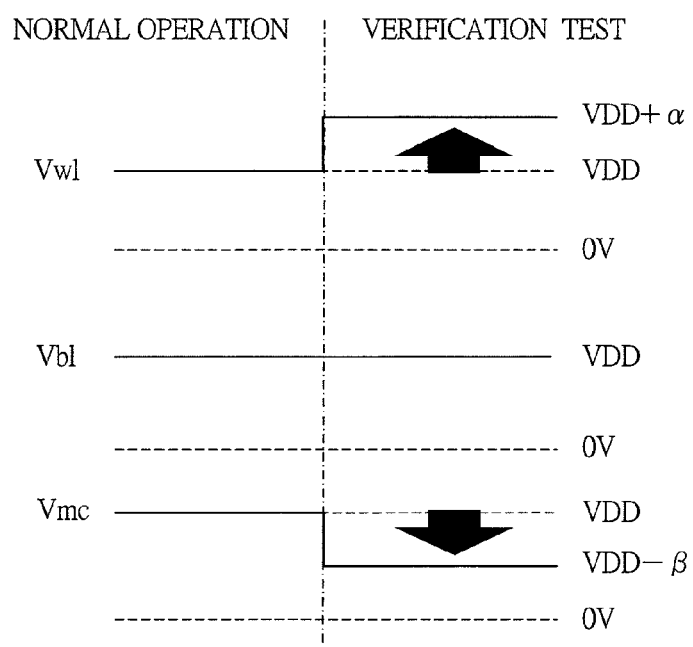
Figure 12:
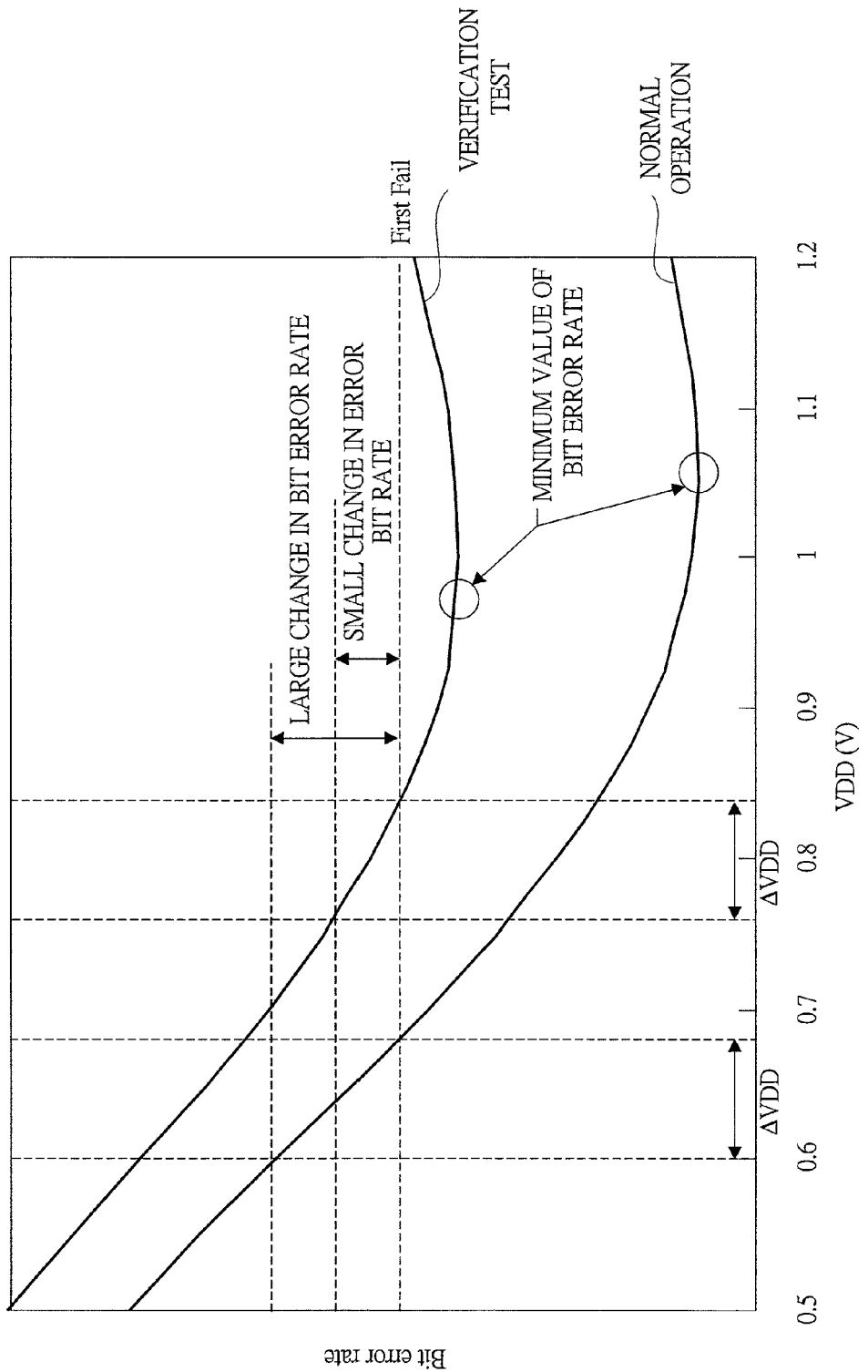
Figure 13:
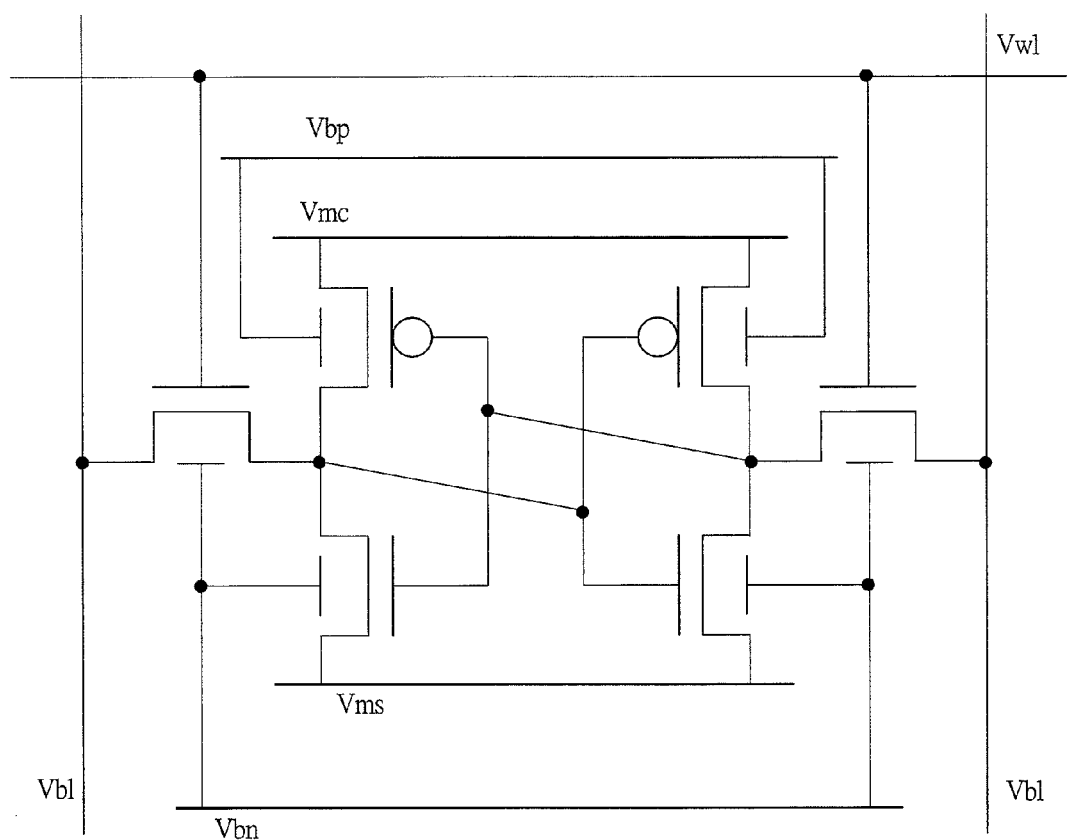
Figure 14:
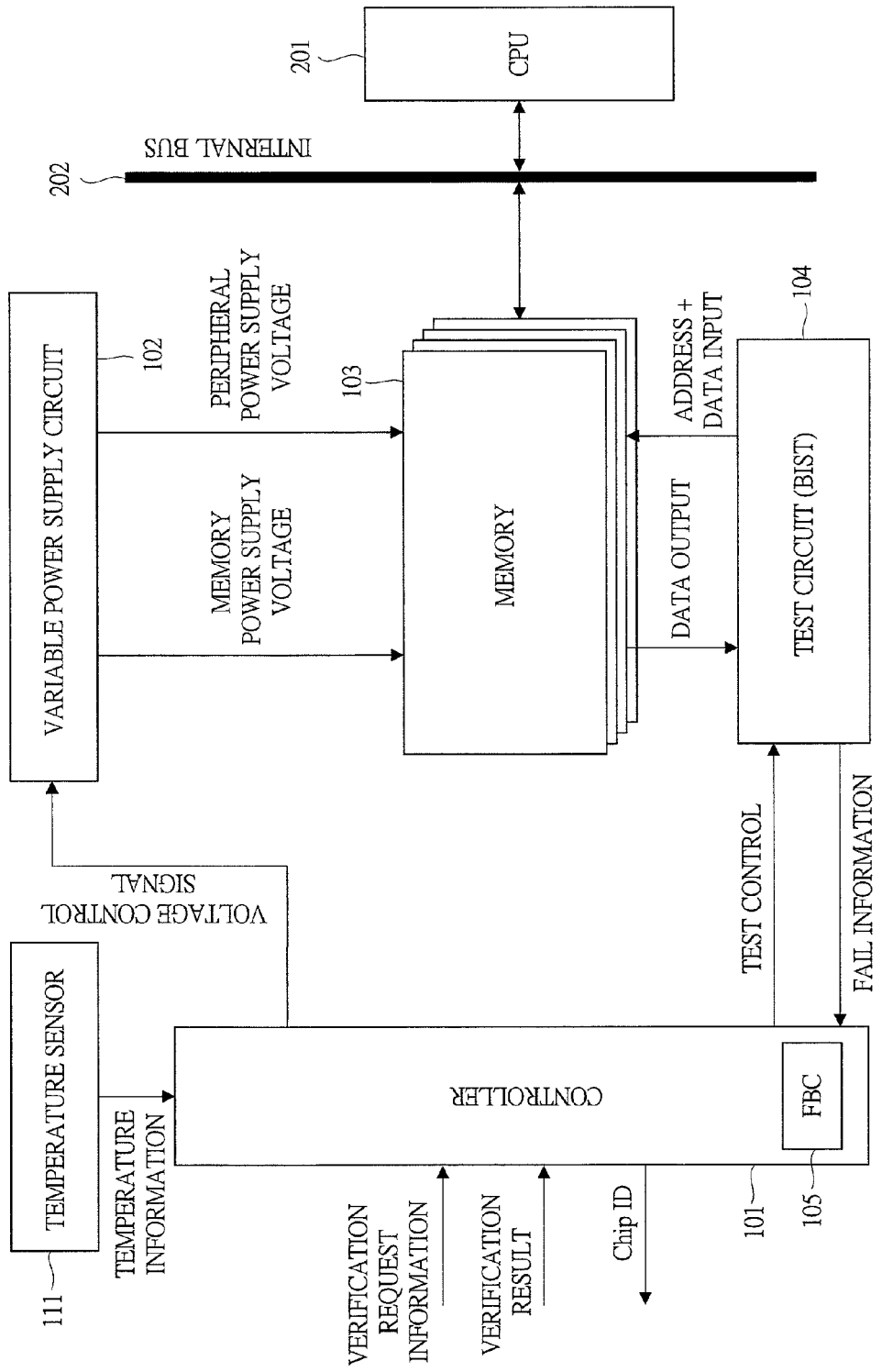
Figure 15:
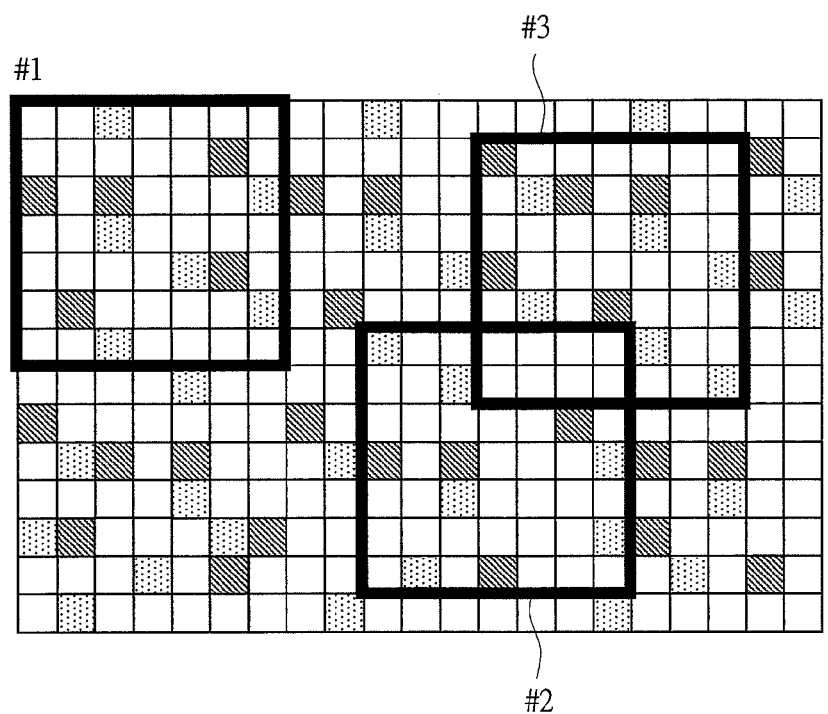
Figure 16:
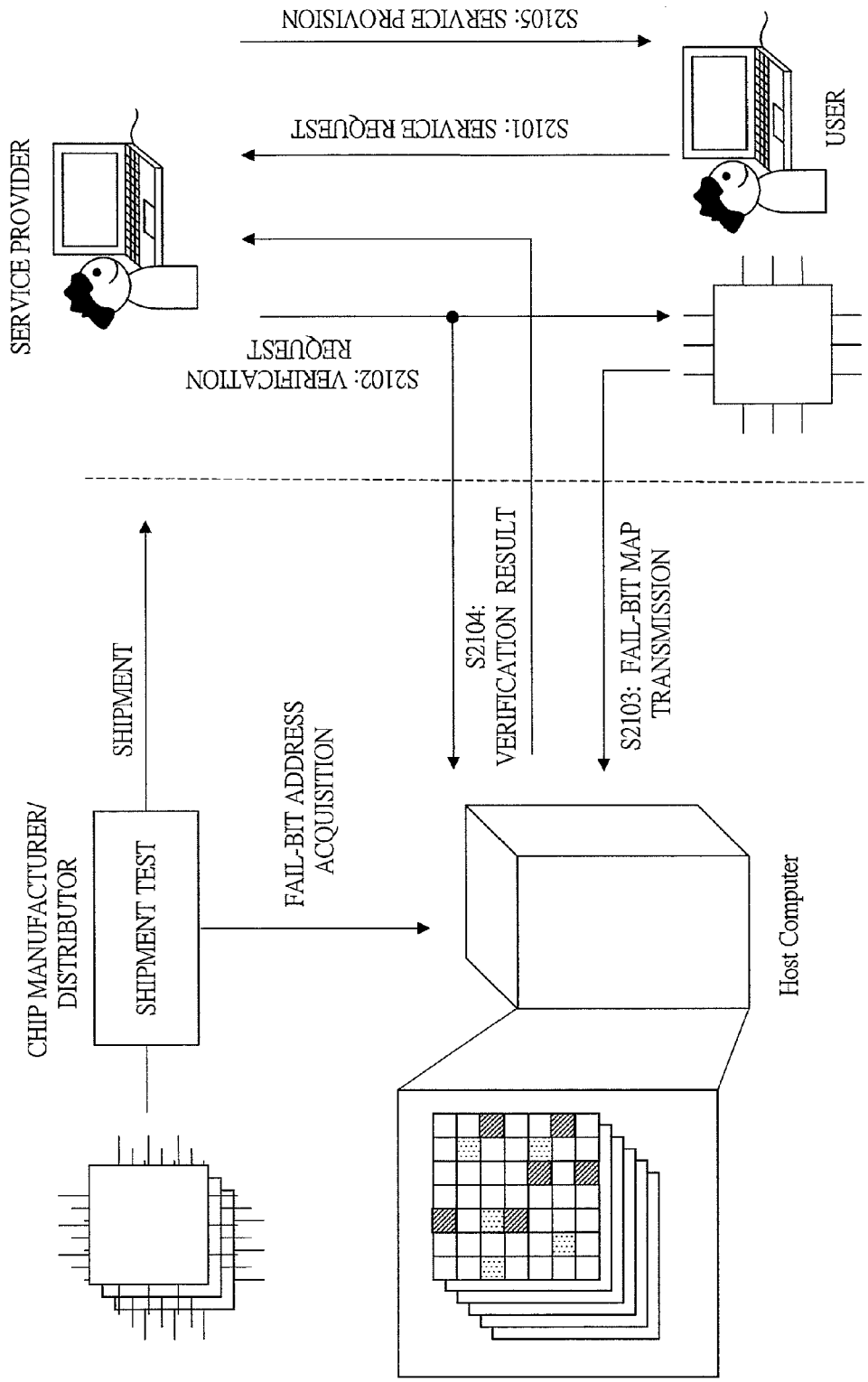
Figure 17:
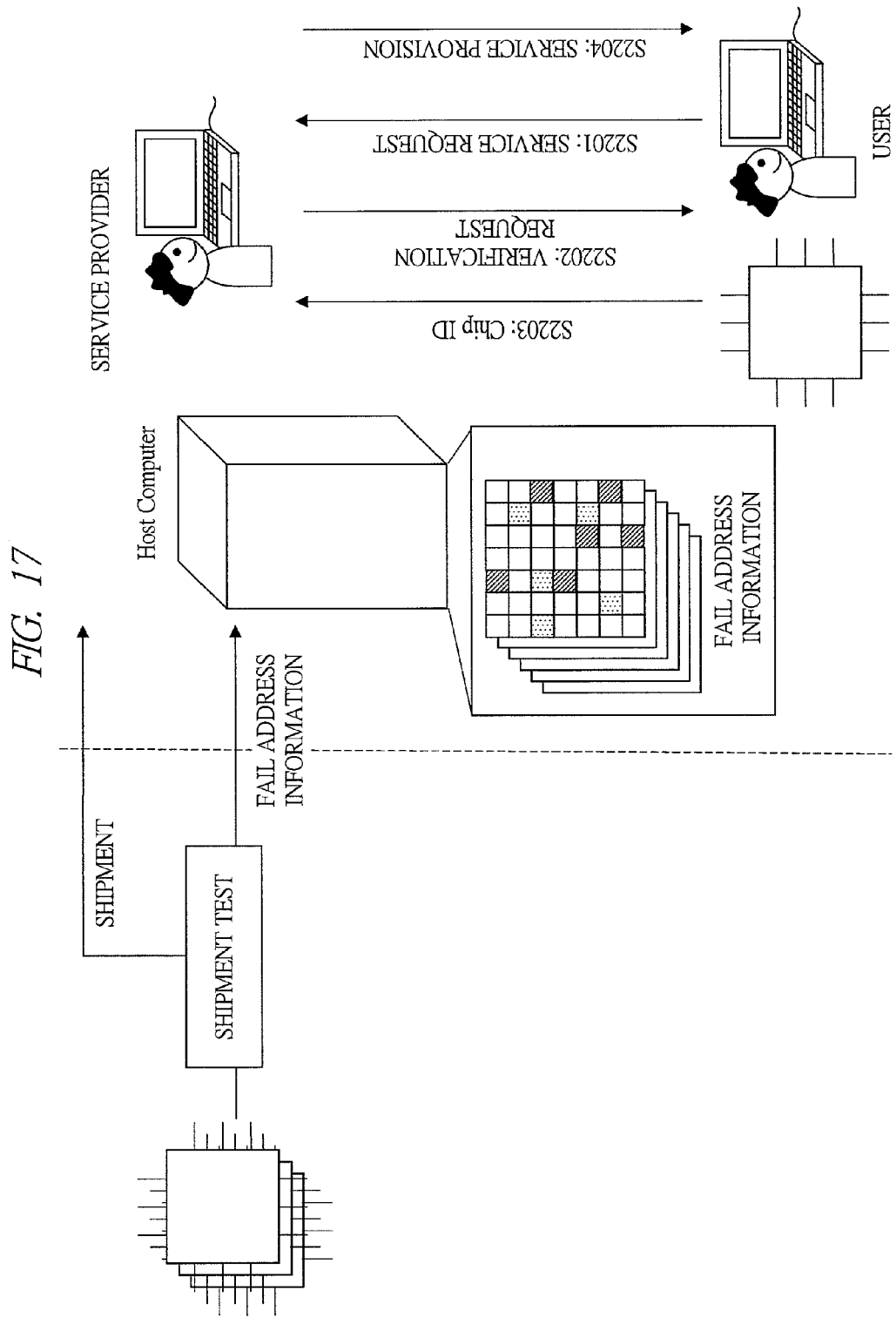
Figure 18:
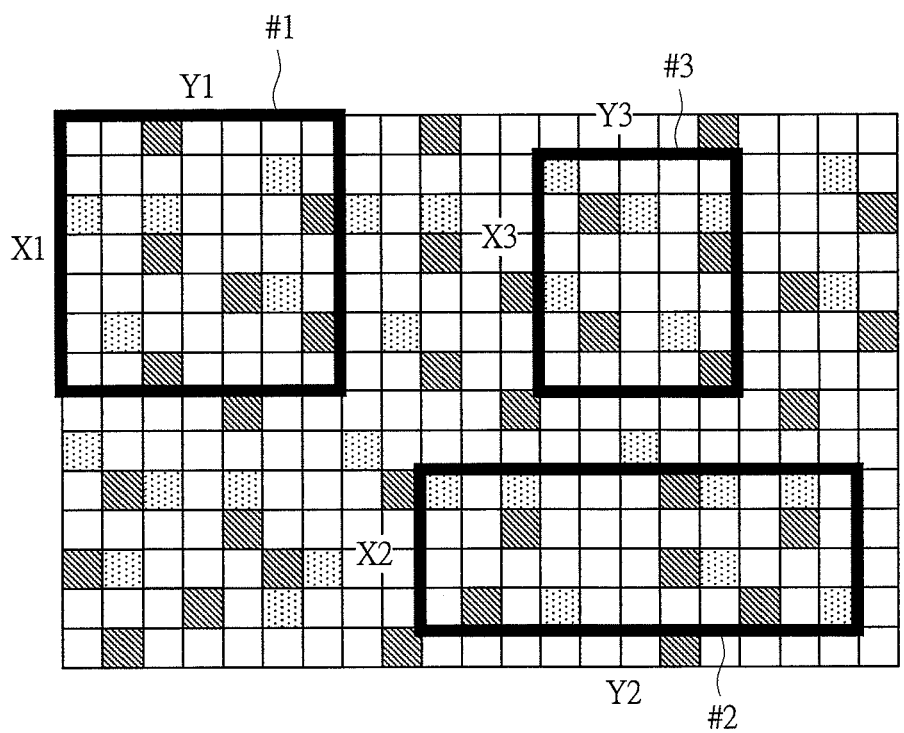
Figure 19:
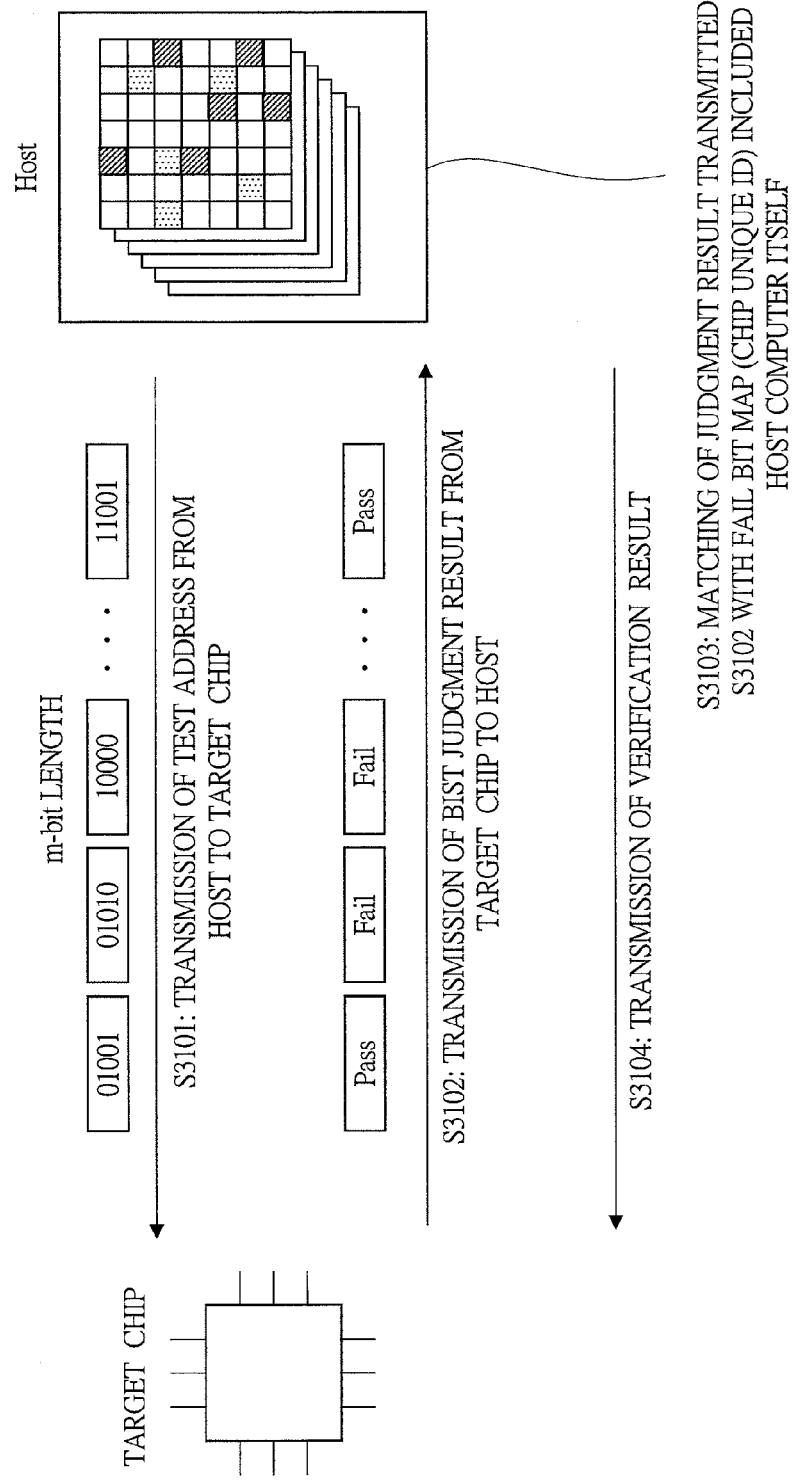
Figure 20:
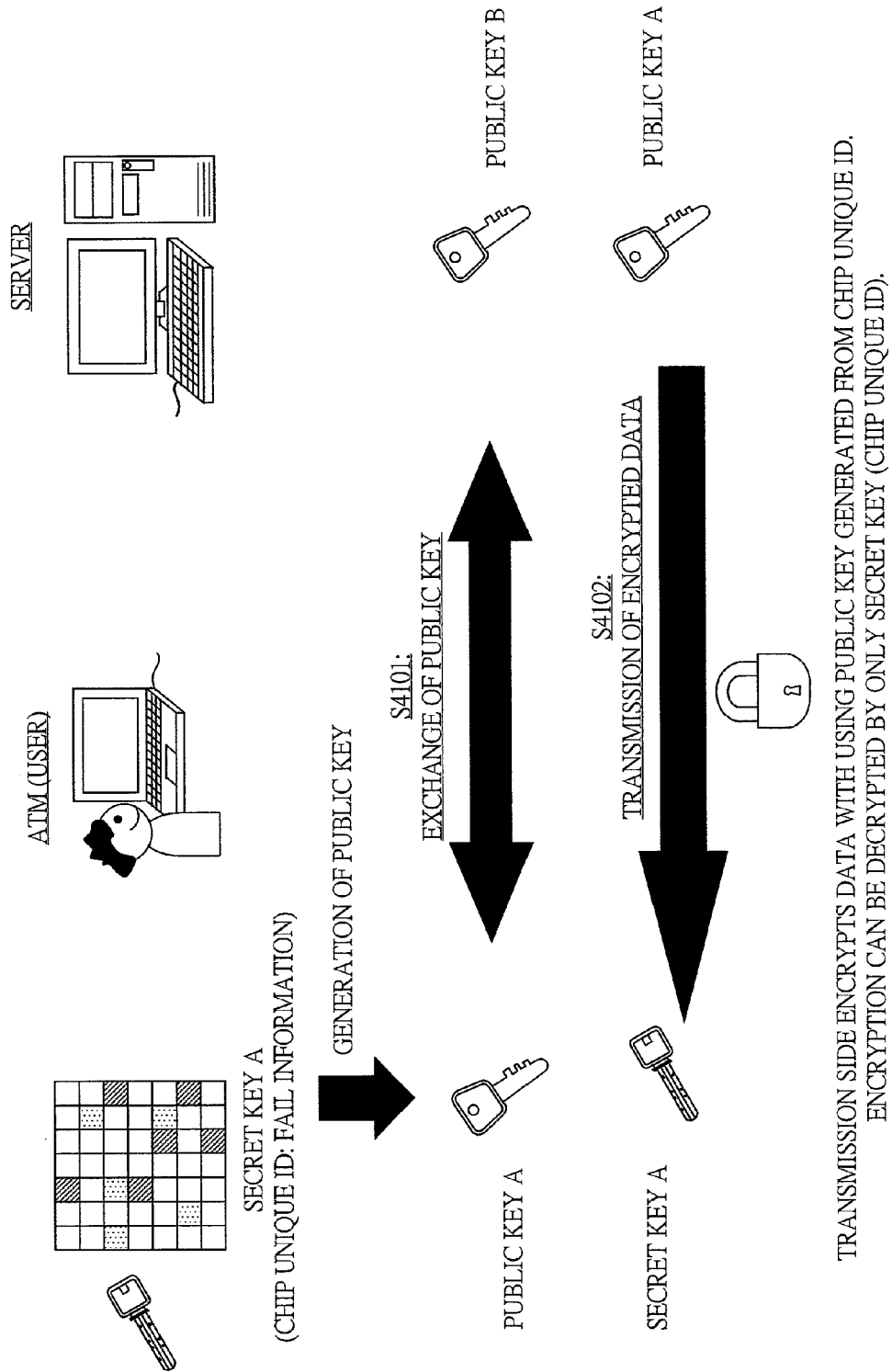
Figure 21:
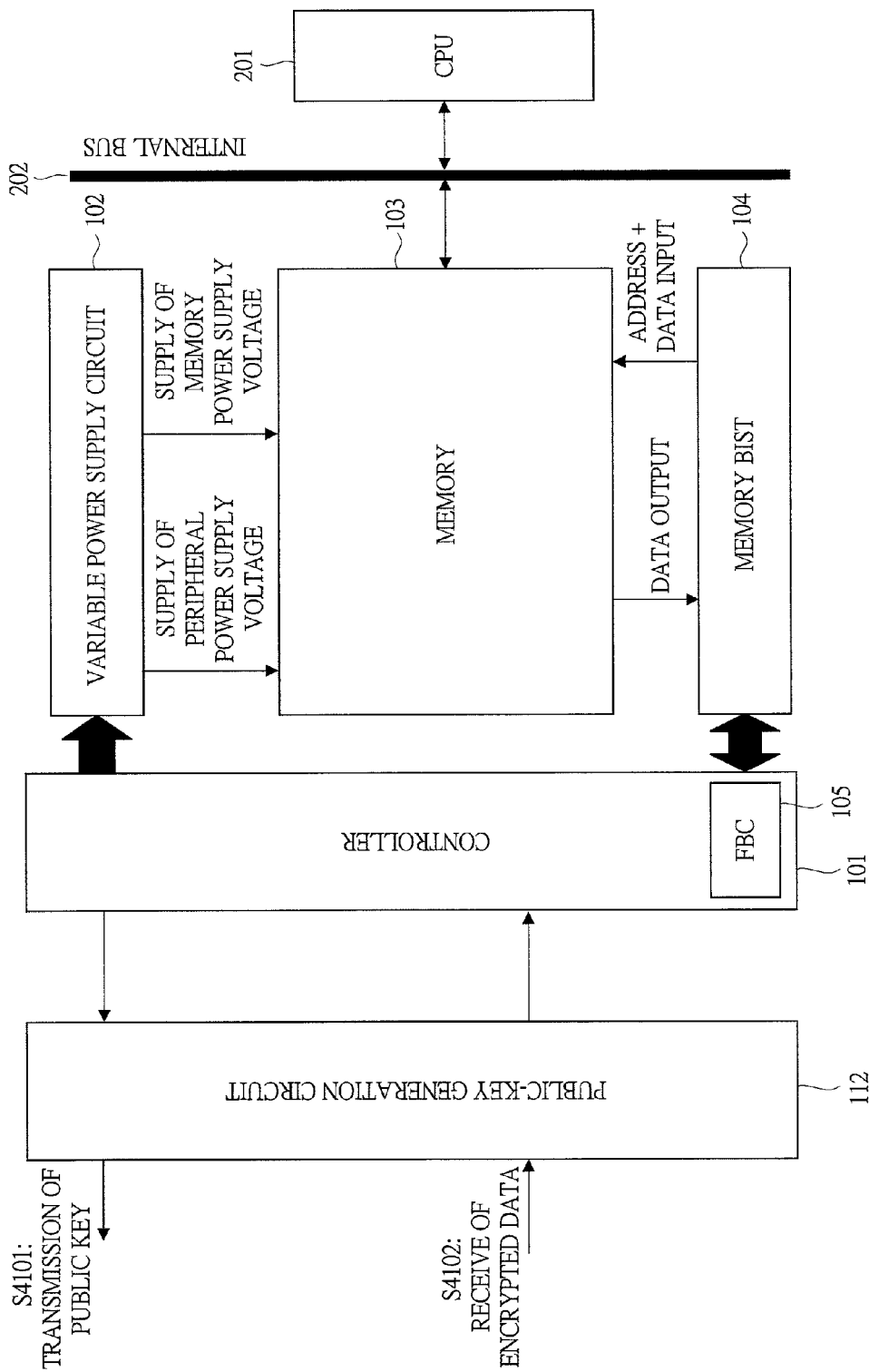
Figure 22:
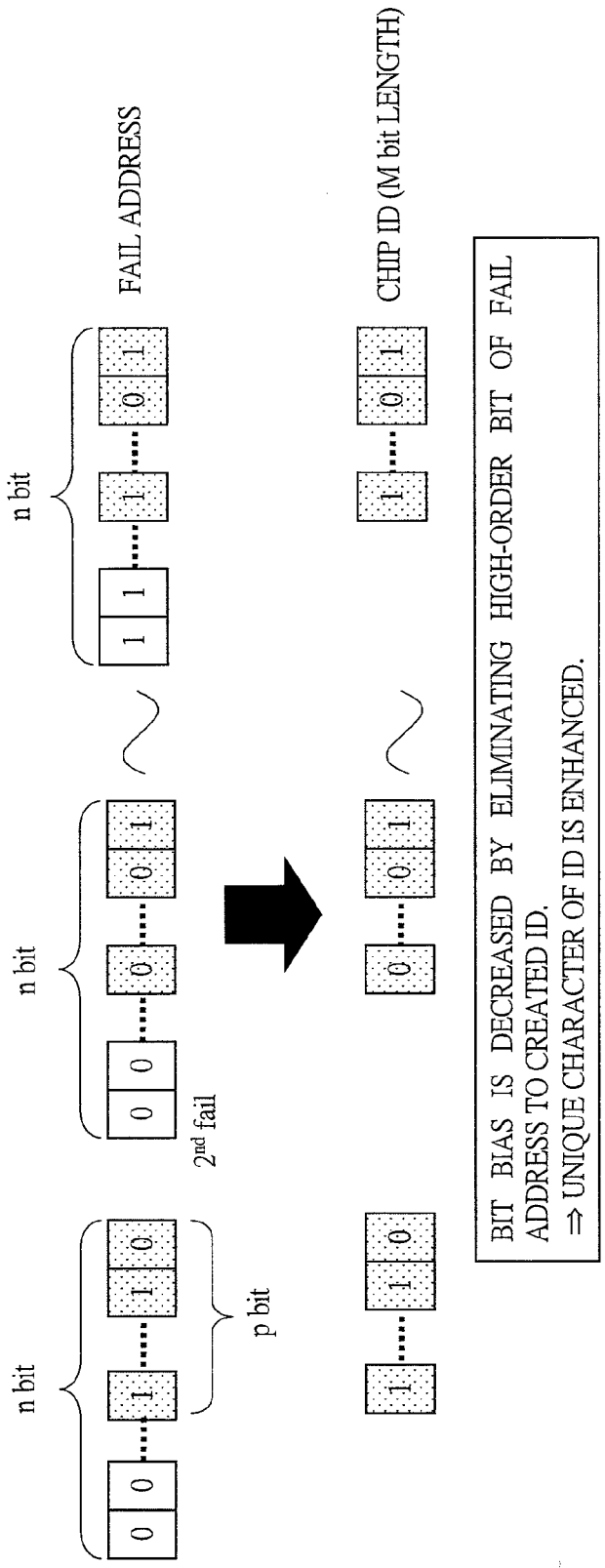
Figure 23:
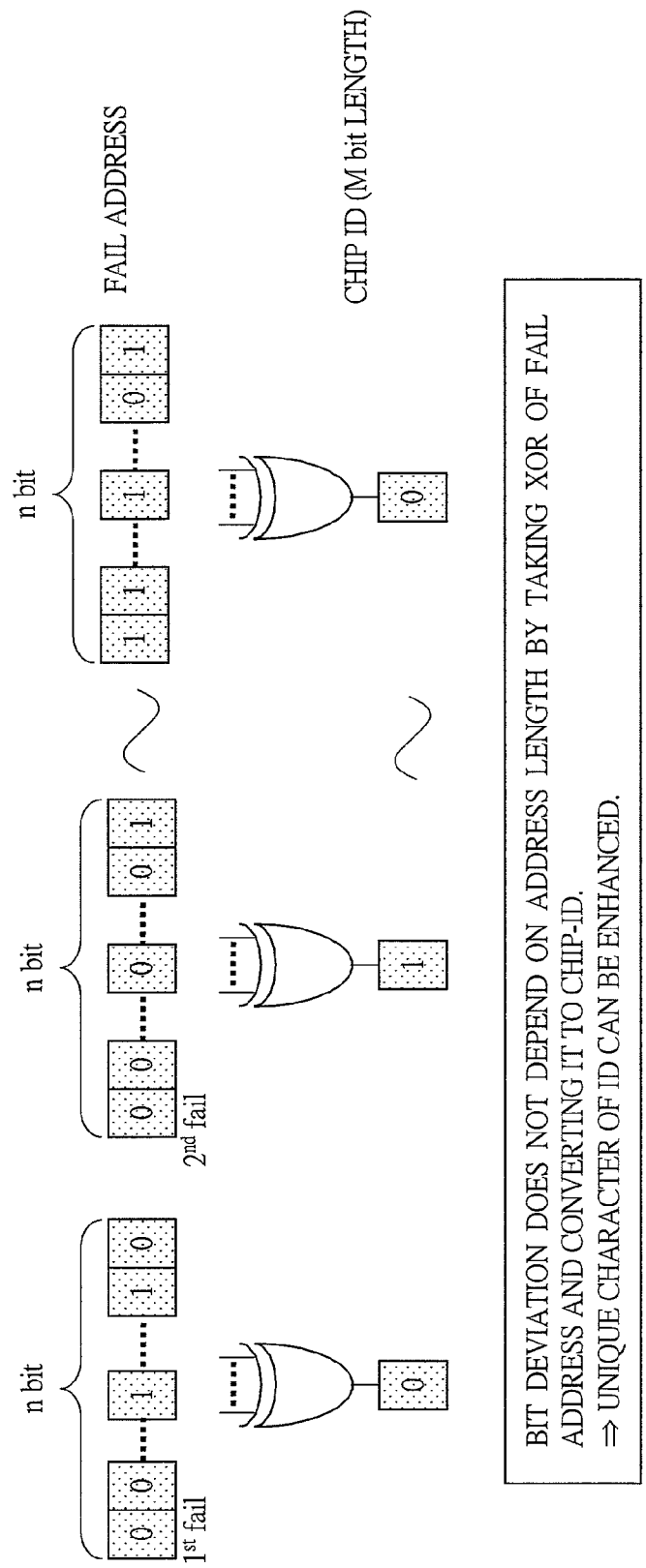
Figure 24:
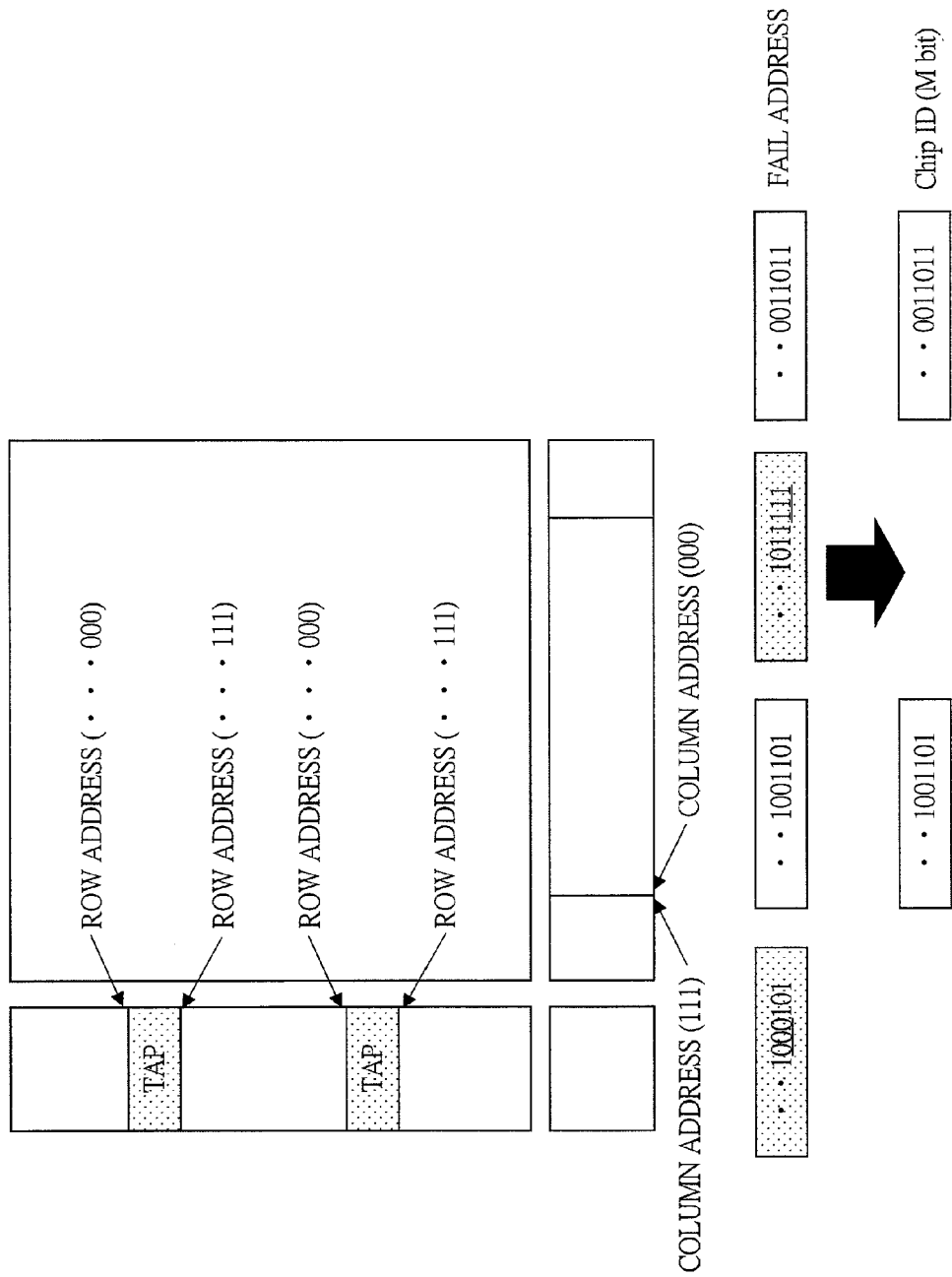
Figure 25:
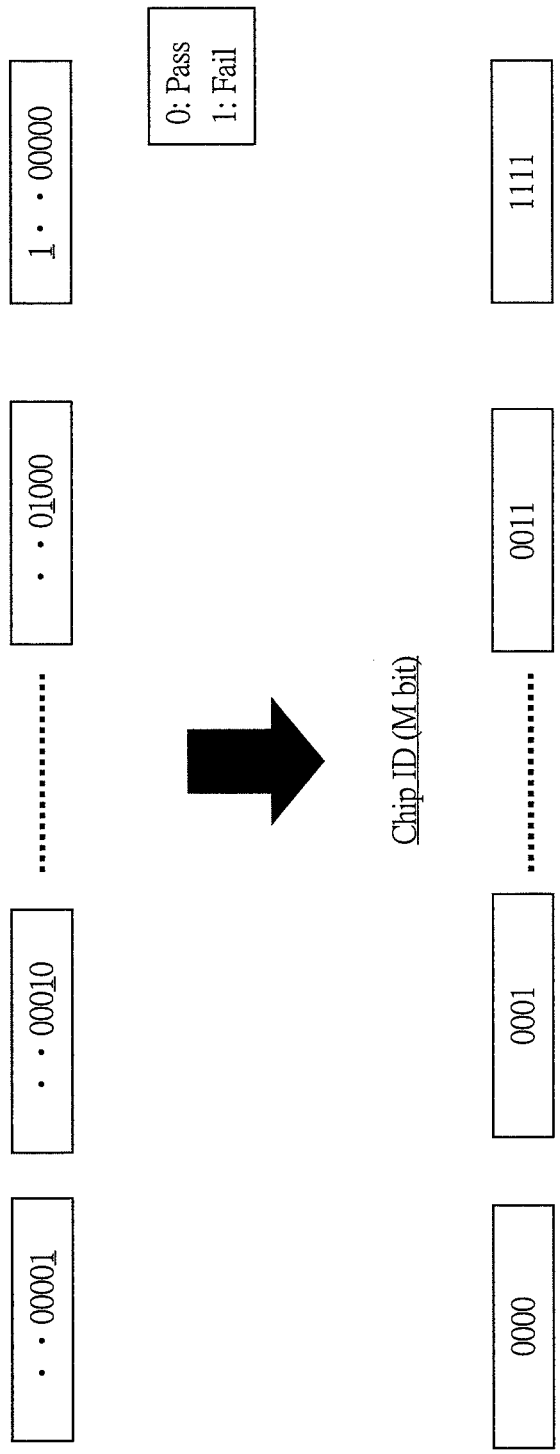
Figure 26:
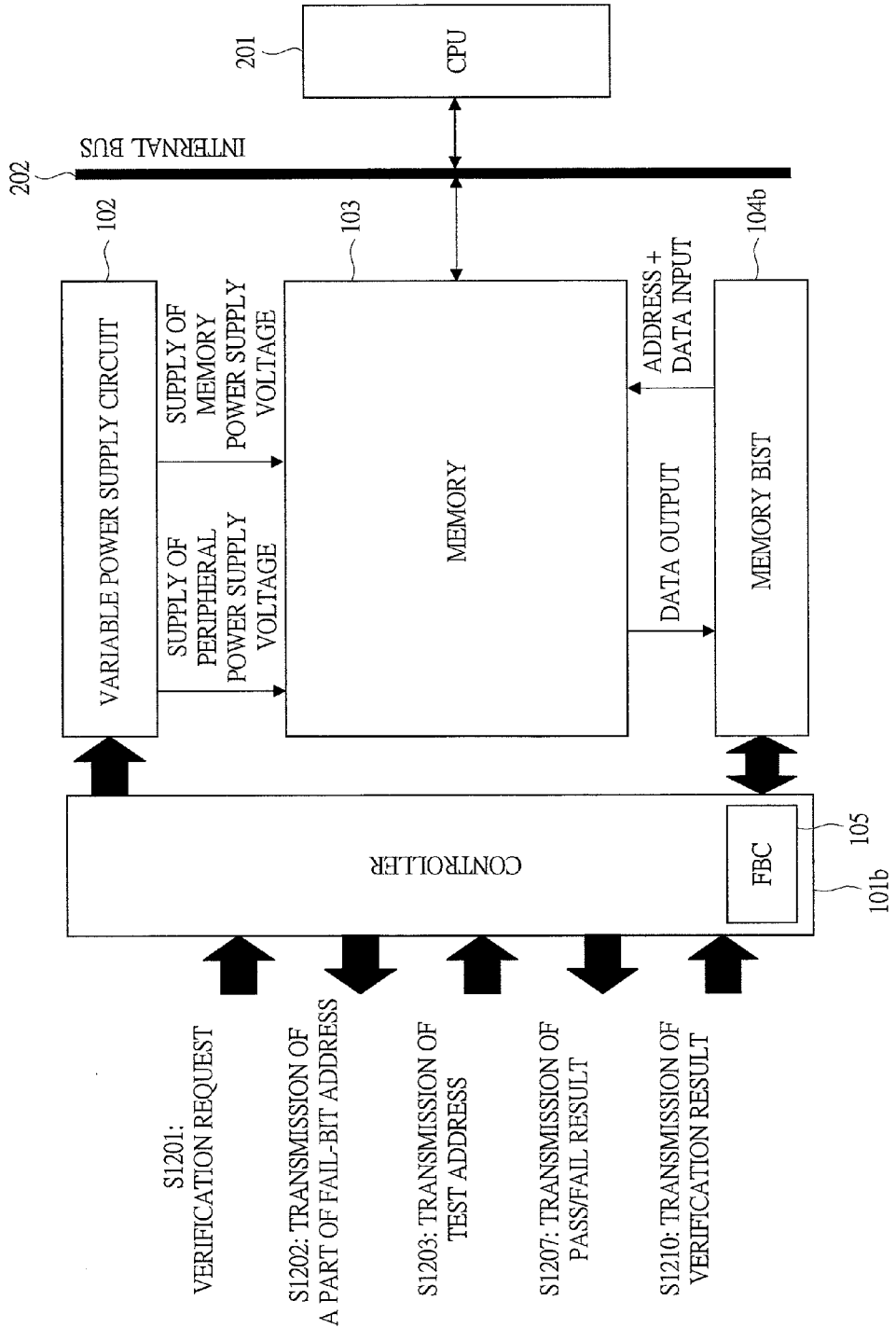
Figure 27:
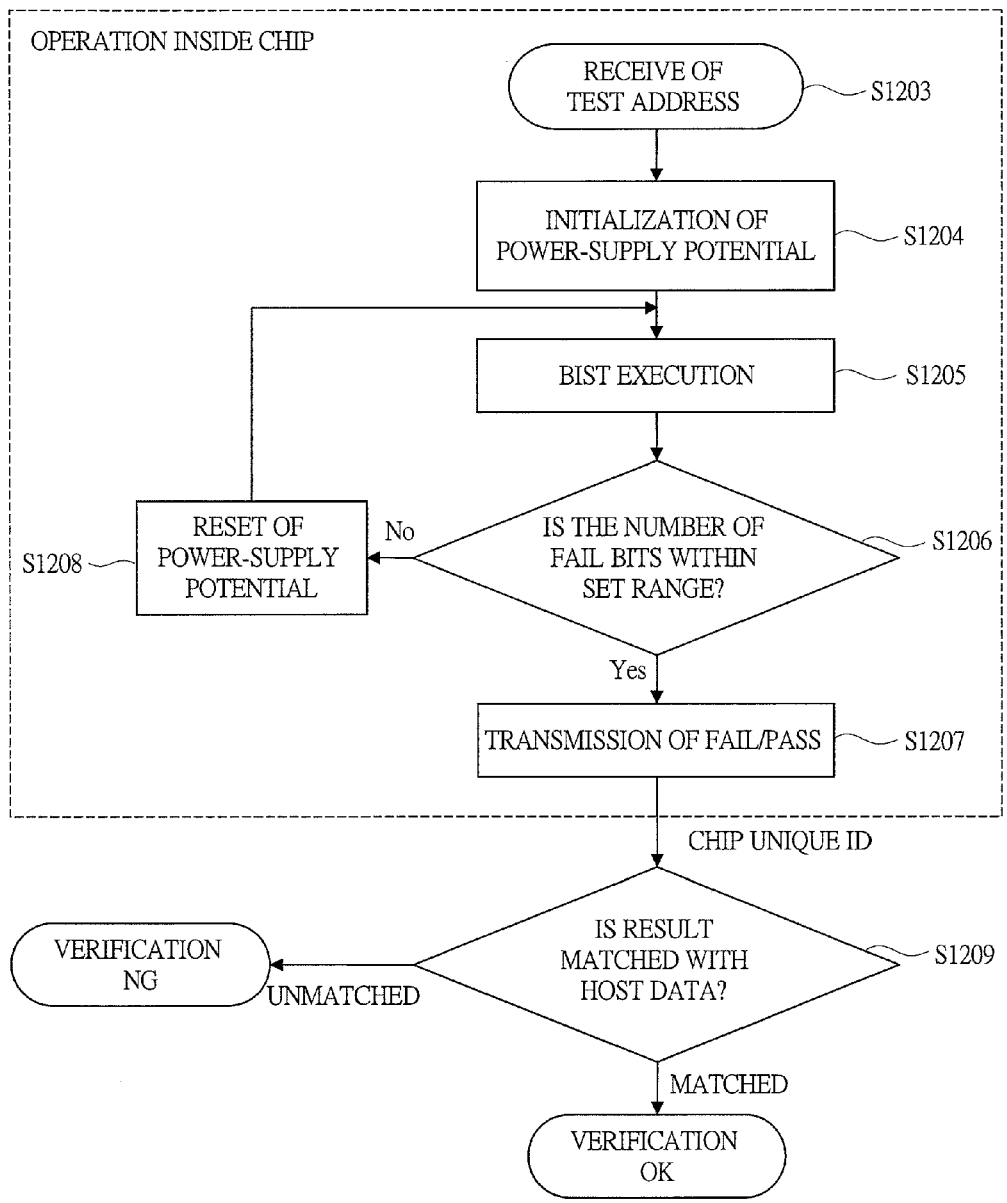

FIG. 1A is a conceptual diagram for describing an operation of Non-Patent Document 1;

FIG. 1B is another conceptual diagram for describing the operation of Non-Patent Document 1;

FIG. 2 is a diagram in a case that a technique of Non-Patent Document 1 is applied to inspection for a cell array;

FIG. 3 is a conceptual diagram for describing an operation of Non-Patent Document 2;

FIG. 4 is a conceptual diagram showing a basic concept of an operation according to a first embodiment of the present invention;

FIG. 5 is a diagram showing an example in generating a chip-unique ID according to the first embodiment of the present invention;

FIG. 6 is a conceptual diagram showing an operation in applying an SRAM according to the first embodiment of the present invention;

FIG. 7 is an internal structure diagram of a chip according to the first embodiment of the present invention;

FIG. 8 is a flowchart of a verification operation according to the first embodiment of the present invention;

FIG. 9 is a block diagram showing a structure of a circuit for executing a step S1102;

FIG. 10 is a circuit diagram showing an SRAM and voltages targeted for assist level adjustment according to a second embodiment of the present invention;

FIG. 11 is a conceptual diagram showing directionality of the assist level adjustment according to the second embodiment of the present invention;

FIG. 12 is a diagram showing a simulation result of a bit error rate;

FIG. 13 is a diagram for describing an action for degradation of a reading-operation margin of a memory cell;

FIG. 14 is an internal structure diagram of a chip according to a fifth embodiment of the present invention;

FIG. 15 is a conceptual diagram related to a method of using a fail bit map (chip-unique ID) on a host computer side according to an eighth embodiment of the present invention;

FIG. 16 is diagram showing a process flow in a case that a host computer is located at a chip manufacturer/distributor;

FIG. 17 is a diagram showing a process flow in a case that the host computer is located at a service provider;

FIG. 18 is a conceptual diagram related to a method of using a fail bit map as a chip-unique ID on a host computer side according to a ninth embodiment of the present invention;

FIG. 19 is a conceptual diagram showing a processing method according to a tenth embodiment of the present invention;

FIG. 20 is a diagram used for describing an eleventh embodiment of the present invention;

FIG. 21 is an internal structure diagram of a chip according to the eleventh embodiment of the present invention;

FIG. 22 is a conceptual diagram according to a twelfth embodiment of the present invention;

FIG. 23 is a conceptual diagram according to a thirteenth embodiment of the present invention;

FIG. 24 is a conceptual diagram according to a fourteenth embodiment of the present invention;

FIG. 25 is a conceptual diagram according to a fifteenth embodiment of the present invention;

FIG. 26 is an internal structure diagram of another chip according to the first embodiment of the present invention; and FIG. 27 is a flowchart of another verification operation according to the first embodiment of the present invention.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components are not always indispensable unless otherwise stated or except the case where the components are apparently indispensable in principle. In addition, a circuit element configuring each functional block of each embodiment is formed on a semiconductor substrate made of single crystal silicon or others by an integrated circuit technique such as a CMOS (complementary MOS transistor) although not particularly limited. Note that, in the embodiments, when "MOSFET (Metal Oxide Semiconductor Field Effect Transistor or abbreviated as MOSFET transistor)" is described, a non-oxidized film is not eliminated as a gate insulating film.

Hereinafter, with reference to figures, embodiments of the present invention will be described.

First Embodiment

FIG. 4 is a conceptual diagram showing a basic concept of an operation according to a first embodiment of the present invention. And, FIG. 5 is a diagram showing an example in generating a chip-unique ID according to the first embodiment of the present invention.

In the present invention, a fact that an error is caused by gradually decreasing an operation voltage of a transistor in a chip is used for generating the chip-unique ID. Note that a dynamic chip such as a DRAM is assumed here.

As clearly seen from FIG. 4, as long as a non-defective product, all transistors perform a normal operation when a standard voltage is applied to the transistors in a chip. Note that the standard voltage is a power supply voltage used for the normal operation, and the normal operation is a state in which a power supply voltage used for memory reading/updating operation is applied as assumed in a case that a non-defective information storage medium such as a non-defective DRAM is mounted on a product.

However, when the voltage applied to the transistor is decreased, stability of the operation of the transistor is gradually decreased. This is because the voltage becomes equal to or lower than a threshold voltage Vth of the transistor.

The threshold voltage of transistor in the chip varies among not only products or lots but also chips. Therefore, when the voltage applied to the transistor is changed to 90% of the standard voltage, 80% thereof, and 70% thereof, a situation of the error occurrence is changed. For example, a situation that "L" is shown although it is supposed to originally show "H" is caused (see a right side in FIG. 4). The usage of this situation is a central technique of the present invention. In FIG. 5, a method of the usage is described.

In an example of FIG. 5, in 80% of the standard voltage (1 V), a probability of the occurrence of the error is 6/49. Also, in 60% of the standard voltage, the probability of the occurrence of the error is 11/49.

This fail bit map is used as the chip-unique ID. At this time, design matters are what % of the standard voltage is used as the chip-unique ID or what % thereof is combined with certain % thereof to be used.

This chip-unique ID is registered in a database of a host computer. At communication between the chip and the host, a low voltage test (=acquisition of fail information) is performed, and fail information is also verified with the chip-unique ID on the database of the host computer.

The process uses difficulty of a fail address reproduction due to influence of a data retention time of the transistor.

Conversely, when an SRAM is used, a potential of a retaining node does not depend on the data retention time, and the fail address is determined by the variation of the thresholds of the transistors. Therefore, the fail bit map in the operation at the low voltage is easily reproduced. An action for this is also considered.

FIG. 6 is a conceptual diagram showing the operation in the case of applying the SRAM according to the first embodiment of the present invention.

In the SRAM, there is a static noise margin (SNM) as an index indicating an operation margin. The static noise margin is an index indicating whether a data stored in a memory cell is destroyed or not when a word line is activated. As this value is larger, the memory cell of the SRAM at reading is more stabilized.

Two pictures on a right side in FIG. 6 are graphs each showing inverter characteristics of the memory cell. As seen from these graphs, compared with the operation at the standard voltage, a substantial square area on an upper right portion of the graph is decreased in driving at the 80% voltage. That is, by performing the low voltage operation, the probability of the occurrence of the random error is increased.

In the SRAM, the test is repeated a plurality of times to judge the occurrence of the error by using the probability of the occurrence at that time. In this manner, similarly to the DRAM or others, the fail bit map can be created by the situation of the occurrence of the error.

Next, the "verification" described above is explained.

FIG. 7 is an internal structure diagram of the chip according to the first embodiment of the present invention. And, FIG. 8 is a flowchart of a verification operation according to the first embodiment of the present invention.

The chip according to the first embodiment of the present invention includes: a controller 101; a variable power supply circuit 102; a memory 103; a memory BIST 104; a CPU 201; and an internal bus 202.

The controller 101 is a controlling circuit which controls an inside of the chip. In the controller 101, a fail bit counter (FBC) 105 and others are included. This fail bit counter 105 is a counter circuit which counts the number of fail bits on the SRAM.

It is considered that main control targets of the controller 101 are 1) output control from the variable power supply circuit 102, 2) instruction of test execution to the memory BIST 104 and acquisition of a test result, and 3) judgment control as to whether to verify an external input/output and encode/decode corresponding to the external input/output. The present specification describes that all of the above-described targets are executed by the controller 101. However, they may be executed by different modules for each control target. It is also considered to separate the targets such that the target 1) is executed by a power supply controlling unit, the target 2) is executed by a memory BIST controlling circuit, and the target 3) is executed by a verification input/output unit.

The variable power supply circuit 102 is an on-chip variable power supply circuit for providing the standard voltage at normal time and a different voltage from the standard voltage at verification time. Note that it is the on-chip here. However, it may be a variable power supply circuit outside the chip.

Also, in the memory 103, not only the memory but also a memory peripheral circuit which is not shown exists. A peripheral power supply voltage for operating this memory peripheral circuit is also supplied by the variable power supply circuit 102. A design matter is whether this peripheral power supply voltage as an output from the variable power supply circuit 102 is variable or not.

The memory 103 is a memory targeted for the device verification. As the internal structure, the memory 103 includes: a memory array 103a; a memory selecting circuit 103b; and a reading/writing circuit 103c.

The memory array 103a is a volatile memory element group including a plurality of ferroelectric memory cells provided on a semiconductor substrate. It can be considered that the memory element used here is an SRAM, a DRAM, or others. However, this is not limited to them.

The memory selecting circuit 103b is a circuit for operating a word-line potential Vwl for specifying the memory element targeted for data reading/writing by using an address transmitted from the CPU 201 via the memory BIST 104 and the internal bus 202.

The reading/writing circuit 103c is a circuit which sets a writing-target data on a bit-line potential Vbl at the writing time, and which outputs a data stored in a specific SRAM at the reading time for reading the data.

Note that, in FIGS. 14, 21, and 26 which will be described later, the structure in the memory 103 is omitted.

The memory BIST 104 is a test circuit for executing a test according to the present invention. Various types of an output from the memory BIST 104 to the controller 101 can be considered. For example, the types includes: an output of an address of an error location; an output of an original data read at the test execution; and others. A design matter is what mode is used for the output from the memory BIST 104 in addition to the processing in the controller 101.

In any case, a test content is the reading of the data in the memory 103 at the different voltage from the standard voltage (in most cases, which is lower than the standard voltage) set by the variable power supply circuit 102.

Basically, the test content in the memory BIST 104 is the performing of means for writing the data by the memory BIST 104 on an address specified by the memory BIST 104, and judging whether the same one as the written data is obtained or not in reading the data from that address. However, the content is not limited to this. In the test, the memory BIST 104 may input a reset signal to the memory 103, and then, it may be judged whether an initial value is read or not.

At this time, as a test target by the memory BIST 104, it can be considered that only the data on the address specified by the controller 101 is tested, a certain amount of memory is tested, or others. A design matter is how the target is set.

The CPU 201 is a central processing control device which uses the memory via the internal bus 202 at the normal operation time.

The internal bus 202 is a general-purpose internal bus which connects between the memory 103 and the CPU 201 or others. At the normal operation time, data communication with the memory 103 via the internal bus is performed in many cases.

The operation at the verification time is described with using these functions.

First, the controller 101 receives a verification signal from outside of the chip (here, from the host computer). In response to this, the controller 101 transmits a voltage control signal to the variable power supply circuit 102 to initialize a power supply level of the memory (step S1101).

After the output from the variable power supply circuit 102 is stabilized, the controller 101 instructs the test execution to the memory BIST 104 (step S1102). When this test by the memory BIST 104 is performed for the memory 103, an acceleration test is performed. When the DRAM is the verification target, a simpler method than that for the memory 103 is performed.

At this time, it is judged whether the number of fail bits is within a set range or not. The set range of the number of fail bits is determined at the designing time. It is judged whether the number of fail bits is within the set range or not by using the fail bit counter 105 and a comparator 106 not shown in this figure.

If the number of fail bits has not been within the set range (No at step S1103), the controller 101 resets the power supply level with using the variable power supply circuit 102 (step S1105).

If the number of fail bits has been within the set range (Yes at step S1103), the fail bit address is read, and the fail bit map is outputted as a chip-unique ID to the outside of the chip (step S1104).

The fail bit counter 105 is a counter which counts how many fail bits occur. In the figure, the number of fail bits is counted based on how many times the address of the fail bit is inputted. However, as long as the information indicating the number of fail bits, the inputted information is not limited to the address of the fail bit.

FIG. 9 is a block diagram showing a structure of a circuit for executing this step S1102. This circuit is mounted as a part of the controller 101.

The comparator 106 is a comparator which compares an output from the fail bit counter 105, that is, the number of fail bits, and a set upper limit value of the number of fail bits.

When a condition of "the number of fail bits">"the set upper limit value of the number of fail bits" is established, "L" is outputted as a comparison result. When a condition of "the number of fail bits"<"the set upper limit value of the number of fail bits" is established, "H" is outputted as the comparison result.

A voltage control signal generator 107 is a circuit which generates a signal for instructing the voltage reset of the variable power supply circuit 102 when the comparison result is "L".

A Chip ID generator 108 is a circuit which generates a Chip ID (=fail bit map) from the fail bit address when the comparison result is "H".

By using these circuits, the steps S1103, S1104, and S1105 can be processed. However, the circuits are not always limited to them.

In the host computer, the fail bit address written on the fail bit map of the chip and the fail bit map information previously stored in the database of the host computer are verified. In this manner, the host computer performs the verification (step S1106).

It is described above that the fail bit map itself as the test result is communicated. However, only the addresses of the fail bits are transmitted as one batch, and they are assigned on the fail bit map contained in the host computer, so that their verification can be judged on the host computer.

As a modification of the processing in FIG. 8, it is considered that the data is received from the outside and the verification is made in the chip by judging whether the data matches the error data or not.

FIG. 26 is an internal structure diagram of another chip according to the first embodiment of the present invention. FIG. 27 is a flowchart of another verification operation according to the first embodiment of the present invention.

A basic structure of FIG. 26 is not different from that of FIG. 7. However, a controller 101b and a memory BIST 104b are different from that.

As showed in FIG. 26, the number of times of communication between the controller 101b and an external host computer is increased. Therefore, a structure for handling the increase is taken. On the other hand, there is an advantage that the processing of the memory BIST 104b is lightened because it is not required to transmit the fail bit map.

A basic operation of the memory BIST 104b is also the same as that of the memory BIST 104. However, only BIST for the address instructed by the host computer is performed, a processing amount is extremely lightened. However, in a case that the instruction for a plurality of addresses is made from the host computer, the performance is not limited to this.

Next, with reference to FIGS. 26 and 27, another verification operation according to the first embodiment is described.

First, the host issues a verification request to the chip (step S1201). In response to this, the controller 101b of the chip returns a part of the address of the fail bit of a corresponding chip fixed every time to the host computer not shown (step S1202). At this time, since the part of the returned address of the fail bit has a fixed value, the controller 101b does not have to perform any internal processing except for allocation of a memory working area.

The host computer checks whether the fail bit address transmitted from the controller 101b of the chip at the step S1202 is correct or not. When this fail bit address is the assumed one, the host computer transmits a test address to the controller 101b (step S1203). The transmitted test address is obtained by extracting one, two, or more of the addresses of the fail bits from the fail bit map which is the chip-unique ID contained in the host computer.

After receiving the test fail bit address transmitted from the host computer, the controller 101b transmits a voltage control signal to the variable power supply circuit 102 to initialize the power supply level of the memory (step S1204).

After the output from the variable power supply circuit 102 is stabilized, the controller 101b instructs the test execution to the memory BIST 104 (step S1205).

These steps S1204 and S1205 are the same processes as those of the steps S1101 and S1102. However, at the step S1205, the memory BIST 104 may evaluate only a location specified by the test fail bit address.

In this test, it is judged whether the number of fail bits is within a set range. The set range of the number of fail bits is judged at the designing time. It is judged whether the number of fail bits is within the set range y using a fail bit counter 105 and a comparator 106 not shown in this figure.

When the number of fail bits is not within the set range (No at step S1206), the controller 101b resets the power supply level with using the variable power supply circuit 102 (step S1208). These processes are the same as those of the steps S1103 and S1105 of FIG. 8.

When the number of fail bits is within the set range (Yes at step S1206), the controller 101b transmits Fail/Pass as a test result to the host computer (step S1207).

The host computer transmits the fail bit address, and therefore, if the test result of the address is "Pass", the controller of the chip judges the verification as fail. By contrast, if it is "Fail", the controller judges the verification as success.

In this manner, the verification availability (Fail=verification OK, Pass=verification NG) can be judged on the chip side. Therefore, at a step S1207, not the result of "Fail/Pass" but the result of "verification OK/verification NG" may be transmitted.

After receiving the transmission of the Fail/Pass as the test result, the host computer not shown verifies the test result with using the result in the fail bit map stored in the host computer (step S1209).

In the case of the result of "verification OK", the host computer transmits the verification result to the controller 101b (step S1210).

In this manner, the verification operation can be executed by not only the comparison of the fail bit map but also the Fail/Pass judgment of the bit of the specific address.

By using the structure as described above, the memory used for the normal operation can be used for generating the ID, so that the area overhead does not occur.

Note that, if the overhead is allowed to occur, a dedicated circuit may be prepared as the circuit described above. More particularly, it is considered that the structure of the SRAM described above can be applied to the DRAM.

Second Embodiment

Next, a second embodiment of the present invention is described with reference to figures.

The first embodiment of the present invention describes the basic operation of the present invention. However, in the acquisition of the fail bit map which is easily executed by the description of the flowchart, there is a high possibility that a reproducibility problem arises in, more particularly, the SRAM. Accordingly, improvement of the reproducibility of the fail bit map is described.

Further, in the present embodiment, improvement of reproducibility of the fail bit map by adjusting an assist level of the SRAM is discussed.

FIG. 10 is a circuit diagram showing the SRAM and voltages targeted for adjusting the assist level according to the second embodiment of the present invention.

First, the basic structure of the SRAM is described.

To this SRAM, three voltages are supplied. That is, they are a word-line potential Vwl, a bit-line potential Vbl, and a memory-line potential Vmc.

The memory line potential Vmc is a potential for retaining the memory data. As long as the memory-line potential Vmc exists, this SRAM can retain the memory.

The word-line potential Vwl is a potential indicating the writing/reading availability. Only when this word-line potential Vwl indicates "H", the writing/reading to the SRAM can be performed.

The bit-line potential Vbl is a signal line for setting a writing-target data at the writing time and outputting a data stored inside the SRAM at the reading time.

The number of fail bits is largely influenced by (=depends on) these potentials. Conversely, by actively controlling these potentials, dependency of the number of fail bits on the voltages can be reduced.

FIG. 11 is a conceptual diagram showing directionality of the assist level adjustment according to the second embodiment of the present invention. Also, FIG. 12 is a diagram showing a simulation result of a bit error rate.

As seen from this figure, the word-line potential Vwl has a higher value in the acceleration test at the verification time than in the normal time. By contrast, the memory-line potential Vmc has a lower value in the acceleration test at the verification time than in the normal time.

Conversely, it is required to separately provide the output of the variable power supply circuit 102 to the word-line potential Vwl and the memory-line potential Vmc.

As showed in FIG. 12, when the word-line potential is increased, a β ratio for determining a reading-operation margin is degraded, and a minimum value of the bit error rate is shifted to a low voltage side. At a voltage in vicinity of the minimum value, a slope of the bit error rate is small, and therefore, dependency of the bit error rate on the voltage can be reduced.

On the other hand, by applying a method of adjusting the potentials in a direction of degrading a reading-operation margin of the memory cell, the dependency of the bit error rate on the voltage can also be reduced. FIG. 13 is a diagram for describing an action for the degradation of the reading-operation margin of the memory cell.

In order to degrade this reading-operation margin, the following methods are considered.

1) The memory-line potential Vmc is decreased lower than the power supply voltages (Vwl, Vbl, and other power supplies) of peripheral circuits.

2) A source voltage of the memory cell is increased higher than source voltages of peripheral circuits.

3) The word-line potential Vwl is increased higher than the memory-line potential Vmc (however, the power supply voltages (Vbl and other power supplies) of peripheral circuits are the same as that of the memory cell).

4) The bit-line potential Vbl is increased higher than the memory-line potential Vmc (however, the power supply voltages of peripheral circuits (Vwl and other power supplies) are the same as that of the memory cell).

5) A substrate bias voltage Vbp of a pMOS (n Well) is decreased lower than the memory-line potential Vmc.

6) A substrate bias voltage Vbn of an nMOS (p Well) is decreased lower than the memory-line potential Vms.

A combination of the above-described methods may be considered.

Similarly, in the writing operation, by adjusting the potentials in a direction of degrading the writing-operation margin of the memory cell, the dependency of the bit error rate on the voltage can also be reduced.

Third Embodiment

Next, a third embodiment of the present invention is described.

In the first embodiment, as seen from FIG. 8, every time the verification request is issued, the memory BIST is operated to acquire the fail bit map.

By contrast, the present embodiment has a feature of using the data retained in the memory cell at power-on time as the chip-unique ID.

The data retained in the memory cell at the power-on time is determined by the random variation of the transistors of the memory cell. This value is retained in an arbitrary location in the memory, and is outputted when the verification request is issued, so that the reproducibility of the acquired data is improved. This is because it is not required to change the power supply voltage as different from the steps S1101 and S1105 (see FIG. 8).

However, the following points should be noted.

When the memory-line potential Vmc and the word-line potential Vwl (see FIG. 10) are simultaneously applied, there is a possibility that the memory cell may be influenced by signals from peripheral circuits. Accordingly, by applying the word-line potential Vwl first, and then, applying the memory-line potential Vmc, the influence from the peripheral circuits can be eliminated.

In this above-described manner, the verification operation can be performed at high speed without performing the processing for the chip-unique ID in each verification request.

Fourth Embodiment

Next, a fourth embodiment is described.

The number of fail bits also depends on temperature. Therefore, the number of fail bits is changed depending on a temperature condition of the target chip.

Accordingly, an on-chip temperature sensor is provided on the verification-target chip. And, the temperature condition at the verification test time is also transmitted to the host computer together with the fail address information.

For handling this, pieces of data of fail bit maps under several types of temperature condition are previously stored in the host computer.

Note that, as a modification example of the present embodiment, it is considered that heating means or others is provided to the chip and the host computer instructs to reproduce the temperature condition at the test to the chip.

In this manner, by comparing the fail information for handling the temperature condition, the influence of the temperature can be reduced.

Fifth Embodiment

Next, a fifth embodiment of the present invention is described with reference to figures.

In the fourth embodiment, by considering the temperature, a more correct fail bit map can be acquired.

By contrast, the present embodiment aims at acquiring the more correct fail bit map by correcting a test voltage based on the temperature condition.

FIG. 14 is an internal structure diagram of a chip according to the fifth embodiment of the present invention.

A difference between FIG. 14 according to the fifth embodiment of the present invention and FIG. 8 according to the first embodiment of the present invention is existence of the temperature sensor 111.

The temperature sensor 111 is a sensor circuit for measuring an internal temperature of the chip.

More specifically, the temperature sensor is used as follows.

It has been described that, after receiving the verification request on the flowchart of FIG. 8, the controller 101 transmits the voltage control signal to the variable power supply circuit 102 at the step S1101 to initialize the power supply level of the memory. The present embodiment has a feature that information of an assumed temperature (assumed temperature information) is also contained in the verification request at this time.

When the controller performs the processing at the step S1101, the controller compares a measured internal temperature by the temperature sensor 111 and the assumed temperature information attached to the verification request.

Depending on either the measured internal temperature is higher or lower than the assumed temperature information, the controller 101 changes a content of the voltage instruction to the variable power supply circuit 102. In this manner, by absorbing a difference between the assumed temperature information and the measured internal temperature, expected fail bit information can be acquired.

Sixth Embodiment

Next, a sixth embodiment of the present invention is described.

In the case of the volatile medium such as the DRAM, it is assumed that the processing of acquiring the fail bit map is executed once in the first embodiment. However, as described in the fourth and fifth embodiments, the accuracy of acquiring the fail bit map is also changed depending on conditions such as the setting accuracy of the voltage of the variable power supply circuit 102 and the temperature.

Accordingly, for the verification request issued once, the controller 101 performs evaluation a predetermined number of times (N times). And, at end of the evaluation performed N times, the controller 101 takes the logical multiplication (AND) of all fail bit maps acquired through the evaluation performed N times. And, the controller 101 returns the result to the host computer which is a source of the verification request.

In response to this, when a condition of "the results of the test performed a plurality of times ⊆ the chip-unique ID on the host computer" is established, the host computer establishes that the verification has succeeded. In this manner, an accidentally-occurring error can be excluded, so that the verification accuracy can be increased.

As a modification example of this, the logical addition (OR) is taken instead of the logical multiplication. And, the controller 101 returns the result of this logical addition to the host computer which is the source of the verification request.

In response to this, when a condition of "the results of the test performed a plurality of times ⊆ the chip-unique ID on the host computer" is established, the host computer establishes that the verification has succeeded. Also in this manner, an accidentally-occurring error can be excluded, so that the verification accuracy can be increased.

Seventh Embodiment

Next, a seventh embodiment of the present invention is described.

When the verification request is issued, the acquired fail bit map is changed depending on the test environment such as voltage fluctuation or temperature.

Accordingly, in the present embodiment, the verification processing (the steps S1101 to S1105 in FIG. 8) performed by the controller on the chip is operated at a higher voltage than a voltage of the chip-unique ID for the verification processing performed on the host computer.

More specifically, the operation is as follows.

When the standard voltage at the normal operation time of the chip is 1 V, a fail bit map at 0.6 V (60% of a ratio with respect to the standard voltage) is retained on the host computer as the chip-unique ID of the chip.

On the other hand, at the verification request time from the host computer, the controller 101 on the chip instructs the variable power supply circuit 102 to create a fail bit map at 0.8 V (80% of the ratio with respect to the standard voltage).

A relation between the fail bit map acquired by this manner as the test result and the chip-unique ID on the host computer is supposed to be the relation of "the test result ⊆ the unique ID on the host computer". When this condition is established, the host computer establishes that the verification has succeeded, so that the verification accuracy is improved.

In the description above, it is assumed that the voltage of the chip-unique ID on the host computer side is 60% of the ratio with respect to the standard voltage, and the test voltage is 80% of the ratio with respect to the standard voltage.

However, the voltages are not limited to them, and the operation can be achieved also when the voltage of the chip-unique ID on the host computer side is 80% of the ratio with respect to the standard voltage, and the test voltage is 60% of the ratio with respect to the standard voltage. In this case, when a condition of "the test result ⊆ the unique ID on the host computer" is established, the host computer may judge that the verification has succeeded.

Eighth Embodiment

Next, an eighth embodiment of the present invention is described with reference to figures.

In the embodiments described above, the fail bit map is created and used as the chip-unique ID.

In the present embodiment, it is considered that the fail bit map used as the chip-unique ID covers an entire memory area (the SRAM in FIG. 7) of the chip so that a specific address space is the verification target.

FIG. 15 is a conceptual diagram regarding a method of using a fail bit map (chip-unique ID) on a host computer side according to the eighth embodiment of the present invention.

The host computer according to the present embodiment has a fail bit map regarding all memory areas of the memory 103 of FIG. 7. And, there is a feature that a part of the memory areas of the memory 103 is assigned at the verification request time, and the verification request is issued to the chip.

In this manner, by changing the memory area requested from the host computer to the chip every time, an unauthorized access due to the analysis of the data acquired at the verification time can be prevented. More specifically, even if an address indicating an area #1 in FIG. 15 is assigned first for the verification request, the area is changed next time to an area #2 in FIG. 15 or an area #3 in FIG. 15.

This manner is described as follows with reference to the flowchart of FIG. 8.

First, the host computer issues the verification request to the chip. At this time, the host computer issues the verification request to the controller 101 with attaching the specific address of the memory 103.

Subsequently, the controller 101 initializes the power supply potential at the step S1101. The processing at this time is not different from that of the first embodiment.

After the end of the processing at the step S1101, the controller 101 instructs the processing of acquiring the fail bit map, that is, instructs to execute the BIST test to the memory BIST 104 (step S1102). At this time, the fail bit map regarding the address attached to the verification request is acquired.

Hereinafter, the check of the number of fail bits (step S1103) and the transmission of the fail bit map to the requesting-source host computer (step S1104) are processed. At this time, a design matter is either the number of fail bits checked at the step S1103 is to be checked in only the area regarding the assigned address or a predetermined area.

The fail bit map regarding the assigned address is acquired, and is compared with the chip-unique ID derived from the fail bit map regarding the specific address contained in the host computer itself, so that the verification result is derived.

Note that, in the processing described above, security strength is further increased by setting a condition so as not to specify the same address twice or more in the number of times of the specific verification request on the chip side, and, if the verification requests to which the same address is attached are issued during a certain period, ignoring these verification requests.

Next, a method of managing the fail bit map (chip-unique ID) on the host computer side to which the present embodiment is applied is described.

The above description is made with the "host computer". However, a method of providing a service is changed depending on where the host computer is located. Hereinafter, the method of providing the service is described.

As the location of the host computer, 1) a chip manufacturer/distributor and 2) a service provider are considered. Each location is described with reference to figures.

FIG. 16 is diagram showing a process flow in a case that the host computer is located at the chip manufacturer/distributor. And, FIG. 17 is a diagram showing a process flow in a case that the host computer is located at the service provider.

First, the case that the host computer is located at the chip manufacturer/distributor is described.

First, a user of the service provided by the service provider requests the provision of the service to the service provider (step S2101).

In response to this, the service provider executes the verification request which is a trigger in the flowchart of FIG. 8 to the chip used by the user and the host computer on the chip manufacturer/distributor by outputting a chip verification signal (step S2102). By this verification request, the host computer on the chip manufacturer/distributor starts waiting for the transmission in the fail bit map acquired in the test (step S1102).

When the controller 101 of the chip of the user receives the verification request at a step S2102, it performs the process flow of FIG. 8. The controller 101 acquires the fail bit map as the test request, and transmits it (step S1104 of FIG. 8 and the step S2103 of FIG. 16). The host computer on the chip manufacturer/distributor checks a correspondence between the chip-unique ID of the chip included in itself (which is created by cutting out it from the fail bit map obtained by a test at the shipping time) and the received fail bit map, and transmits the verification result to the service provider (step S2104).

If the verification result is acceptable, the service provider starts the provision of the service to the user (step S2105).

Next, the case that the host computer is located on the service provider is described.

Similarly to FIG. 16, a user requests the provision of the service to the service provider (step S2201).

Next, the service provider executes the verification request which is a trigger in the flowchart of FIG. 8 (step S2202).

After receiving the verification request at the step S2202, the controller 101 in the chip of the user executes the processing in the flowchart of FIG. 8, and transmits the fail bit map obtained from the test result as the chip response signal to the service provider (step S2203).

The correspondence among the fail bit map obtained by the test result, the chip-unique ID of the chip included in the service provider itself (created by cutting out it from the fail bit map obtained by a test at the shipping time), and the transmitted fail bit map is checked, and, if the result is acceptable, the service is provided (step S2204).

Note that the chip response signal is assumed to be the fail bit map in the above description. However, on the chip side, the availability of the service provision may be judged, and the result may be returned to the user side.

There are two cases as described above. They should be appropriately selected since there are an advantage and a disadvantage such as the presence or absence of previous preparation (in the case of FIG. 17, it is required to manage the host computer by the service provider) and the amount of use of a communication line (in the case of FIG. 16, there is a possibility of using three communication lines).

Ninth Embodiment

Next, a ninth embodiment is described.

In the eighth embodiment, by specifying the target address every time when the verification request is issued, the security is improved. By contrast, in the present embodiment, the verification request is issued with not only the address but also a data amount of the fail bit map as the test result to be returned.

FIG. 18 is a conceptual diagram regarding a method of using the fail bit map as the chip-unique ID on the host computer side according to the ninth embodiment of the present invention.

As seen from the figure, a data size used as the chip-unique ID is changed. As a result, not only the address but also a size of the fail bit map as the test result targeted to be transmitted/received is changed. Therefore, the transmitted data is changed every time, so that the change helps to further prevent the unauthorized access.

Tenth Embodiment

Next, a tenth embodiment of the present invention is described with reference to figures.

In the embodiments described above, the host computer outputs the verification request, and, in response to this, the controller 101 of the chip executes the BIST for the verification. At this time, by returning the fail bit map obtained as the test result to the host computer, the availability of the verification is judged on the host computer side.

By contrast, the present embodiment has a feature of returning a test result for each address to the host computer and combining a plurality of addresses for the verification.

FIG. 19 is a conceptual diagram showing a processing method according to the tenth embodiment of the present invention.

In the figure, the host computer transmits the test addresses to the controller 101 of a target chip as the verification request (step S3101). At this time, a feature is the transmission of the plurality of addresses.

The controller 101 having received the address executes an independent BIST to the corresponding address.

Here, note that, in the embodiments described above, the controller 101 and the memory BIST 104 check the fail bit for the transistor in a certain area after the assigned address.

By contrast, the present embodiment has a different point that the controller 101 and the memory BIST 104 check the fail bit for only the address.

After checking this fail bit, the controller 101 and the memory BIST 104 judge either the result is normal (Pass in FIG. 19) or anomalous (Fail in FIG. 19).

After obtaining the judgment results of the BIST for all addresses transmitted at the step S3101, the controller 101 transmits them to the host computer (step S3102).

As a result, the verification between the results transmitted at step S3102 and the fail bit map (chip-unique ID) in the host computer is performed (step S3103). If they match each other, the verification is completed.

The verification result is returned from the host computer to the controller (step S3104).

By the structure as described above, even if the data communication at the verification time is deciphered, the address transmitted from the host computer at the next verification time is changed, and therefore, the unauthorized access can be prevented.

Eleventh Embodiment

Next, an eleventh embodiment of the present invention is described with reference to figures.

The embodiments described above consider the application to the verification operation performed when the user side requests the service provision.

By contrast, the present embodiment considers an application of the present invention to a field of electronic commerce via a network such as the Internet. In the present embodiment, the address information for checking the fail bit is used as an encryption key used for the electronic commerce or others.

FIG. 20 is a diagram used for describing the eleventh embodiment of the present invention.

In the present embodiment, a communication between an ATM and a server is assumed.

In the present embodiment, the controller 101 of the chip of the user on the ATM recognizes a fail-occurring address and a non-fail-occurring address from the fail bit map (chip-unique ID) of itself. This address information is referred to as fail information.

A public-key generation circuit 112 described with reference to FIG. 21 extracts arbitrary one, two, or more pieces of the fail information and sets the extracted information as a public key. And, the public-key generation circuit 112 transmits the generated public key to a server (step S4101).

By using the received public key, the server encrypts a data to be transmitted to the public-key generation circuit 112 of the chip of the user on the ATM. Then, the server transmits the encrypted data to the public-key generation circuit 112 of the chip of the user on the ATM (step S4102).

The public-key generation circuit 112 or the controller 101 having received the encrypted data decrypts the encrypted data by using a secret key.

FIG. 21 is an internal structure diagram of the chip according to the eleventh embodiment of the present invention. This circuit handles the Fail/Pass for each address, and therefore, the controller 101 and the memory BIST 104 basically check the fail bit only for the corresponding address similarly to the tenth embodiment.

In addition, in the present embodiment, the input/output processing is performed by not directly the controller 101 but the public-key generation circuit 112.

The public-key generation circuit 112 generates the public key from the address information. And, it also receives the encrypted data transmitted from the server. A design matter is either the public-key generation circuit 112 or the controller 101 decrypts the encrypted data.

As described above, by generating the public key with using the fail bit map and performing the encrypted communication, the security strength can be improved.

Twelfth Embodiment

Next, a twelfth embodiment of the present invention is described with reference to figures.

In an arrangement method in an extraction order of the addresses of n bits from addresses where the error of the fail bit map occurs by the controller 101, the error addresses tend to be biased in an appearance order. For example, in the arrangement in ascending or descending order, high-order bits tend to be necessarily biased.

Also, the addresses of the memory areas of the SRAM or others are arranged so as to be concentrated on a certain address space. Therefore, even without considering how to arrange, the high-order bits tend to be biased.

Accordingly, the present embodiment aims at preventing the bias when the fail bit address is transmitted. FIG. 22 is a conceptual diagram of the twelfth embodiment of the present invention.

That is, several high-order bits of the address are forcibly deleted. And, by outputting the address as the chip-unique ID, the bias of the bits is decreased.

In this manner, unique character of the ID is enhanced, and the security strength can be improved.

Thirteenth Embodiment

Next, a thirteenth embodiment of the present invention is described with reference to a figure.

In the twelfth embodiment, it is discussed that the bias of the bits is decreased by deleting the high-order bits.

By contrast, the present embodiment aims at enhancing the unique character of the ID without depending on the address length by taking an exclusive logical addition of bits forming the fail bit address.

FIG. 23 is a conceptual diagram according to the thirteenth embodiment of the present invention.

As seen from the figure, the exclusive logical addition of the bits forming the fail bit address is taken. In a case of a plurality of addresses, the exclusive logical addition is taken for each address, and their results are connected with each other, so that the chip-unique ID is generated. By transmitting this chip-unique ID, the unique character of the ID can be enhanced without depending on the address length.

Fourteenth Embodiment

Next, a fourteenth embodiment of the present invention is described with reference to a figure.

In the memory, the error tends to occur in vicinity of a TAP end and an IO end. That is, in these locations, there is a possibility that the error addresses are biased. Accordingly, it is discussed that the location where the error tends to occur is excluded from a target for acquiring the fail bit address to create the ID, so that the unique character of the ID is enhanced.

FIG. 24 is a conceptual diagram according to the fourteenth embodiment of the present invention.

In the figure, row addresses " . . . 000" to " . . . 111" correspond to the TAP area. Also, column addresses "111 . . . " and "000 . . . " correspond to an input/output switching part. The fail bit tends to occur at these locations, and therefore, a fail bit distribution tends to be biased.

Therefore, when the controller 101 uses the fail address (for example, in the case of the tenth embodiment), these addresses are excluded to create the chip-unique ID.

In this manner, the unique character of the ID can be enhanced.

Fifteenth Embodiment

Next, a fifteenth embodiment of the present invention is described with reference to a figure.

The present embodiment has a feature of create the chip-unique ID by using a result of comparison between expected values of outputs obtained after the BIST test.

That is, after extracting the bit where the error occurs from the BIST test result, the ID is created by decoding on which bit signal line the error occurs at the output.

FIG. 25 is a conceptual diagram according to the fifteenth embodiment of the present invention.

An upper portion of FIG. 25 shows the expected values in the BIST test result. A bit width of each expected value in the BIST test result is sixteen bits.

On the other hand, a lower portion of FIG. 25 shows the derived chip IDs. A bit width of each chip ID is four bits.

First, it is checked where the error occurs in each expected value in the upper portion. And, its position is decoded, and is indicated with four bits. That is, four bits of "0000" is shown if the error occurs at a 0-th bit of the expected value, "0001" is shown if the error occurs at a first bit thereof, "0010" is shown if the error occurs at a second bit, "1110" is shown if the error occurs at a fourteenth bit, and "1111" is shown if the error occurs at a fifteenth bit.

By outputting the values obtained by decoding these expected values as the chip ID, address dependency can be reduced. As a result, the ID can be created without depending on the address, and therefore, the unique character of the ID can be enhanced.

In the foregoing, the invention made by the inventors has been concretely described based on the embodiments. However, it is needless to say that the present invention is not limited to the foregoing embodiments and various modifications and alterations can be made within the scope of the present invention.

It is assumed that the present invention is used in a chip accessing with verification to a host computer or a server and in a terminal on which the chip is mounted.

What is claimed is:

1. A semiconductor device comprising a memory cell array including a plurality of arranged memory cells to which a first power supply voltage used for a reading/updating operation of a memory and a second power supply voltage used for evaluation can be supplied, wherein,
when a chip verification signal is inputted to the semiconductor device, the second power supply voltage is supplied to the plurality of memory cells, and verification information based on an address of any of the plurality of memory cells from which a different data from a data stored under the first power supply voltage is read is used for a response to the chip verification signal.

2. The semiconductor device according to claim 1, wherein the memory cell is an SRAM.

3. The semiconductor device according to claim 1, wherein the second power supply voltage is lower than the first power supply voltage.

4. The semiconductor device according to claim 1, wherein the verification information indicates availability of an access from the semiconductor device.

5. The semiconductor device according to claim 1, wherein the chip verification signal is inputted from outside of the semiconductor device, and the verification information is outputted to the outside of the semiconductor device.

6. The semiconductor device according to claim 1, wherein the first power supply voltage and the second power supply voltage are power supply voltages supplied to the plurality of memory cells.

7. The semiconductor device according to claim 1, wherein a selection voltage of a word line of each of the plurality of memory cells is higher than the second power supply voltage while the second power supply voltage is supplied.

8. A semiconductor device comprising:
a memory cell array which includes a plurality of arranged memory cells;
a verification input/output unit to/from which a chip verification signal can be inputted and a chip response signal can be outputted;
a variable power supply circuit which can supply at least a first power supply voltage used for a normal operation and a second power supply voltage used for evaluation to the memory cell array;

a test circuit which extracts an address of any of the plurality of memory cells from which an error data is read; and a test-circuit control circuit which generates the chip response signal based on an output from the test circuit.

9. The semiconductor device according to claim 8, wherein the memory cell is an SRAM.

10. The semiconductor device according to claim 8, wherein the second power supply voltage is lower than the first power supply voltage.

11. The semiconductor device according to claim 8, wherein the chip response signal indicates availability of an access from the semiconductor device.

12. The semiconductor device according to claim 8, wherein the chip verification signal is inputted from outside of the semiconductor device, and the chip response signal is outputted to the outside of the semiconductor device.

13. The semiconductor device according to claim 8, wherein the first power supply voltage and the second power supply voltage are power supply voltages supplied to the plurality of memory cells.

14. The semiconductor device according to claim 8, wherein a selection voltage of a word line of each of the plurality of memory cells is higher than the second power supply voltage while the second power supply voltage is supplied from the variable power supply circuit.

15. The semiconductor device according to claim 8, wherein, by inputting the chip verification signal, the verification input/output unit instructs the variable power supply circuit to switch from the first power supply voltage to the second power supply voltage.

16. A semiconductor device comprising: a memory cell array including a plurality of arranged memory cells; a variable power supply circuit which can supply at least a first power supply voltage used for a normal operation and a second power supply voltage used for evaluation to the memory cell array; a control circuit which controls the variable power supply circuit; and a test circuit, wherein the control circuit receiving a chip verification signal instructs the variable power supply circuit to supply the second power supply voltage to the memory cell array, instructs the test circuit to check whether a data stored in the memory cell array match a read data or not, and uses verification information based on an address of any of the plurality of memory cells having an unmatched data as a response to the chip verification signal.

17. The semiconductor device according to claim 16, wherein the memory cell is an SRAM.

18. The semiconductor device according to claim 16, wherein the second power supply voltage is lower than the first power supply voltage.

19. The semiconductor device according to claim 16, wherein the verification information indicates availability of an access from the semiconductor device.

20. The semiconductor device according to claim 16, wherein the chip verification signal is inputted from outside of the semiconductor device, and the verification information is outputted to the outside of the semiconductor device.

21. The semiconductor device according to claim 16, wherein the first power supply voltage and the second power supply voltage are power supply voltages supplied to the plurality of memory cells.

22. The semiconductor device according to claim 16, wherein a selection voltage of a word line of each of the plurality of memory cells is higher than the second power supply voltage while the second power supply voltage is supplied from the variable power supply circuit.

* * * * *